(12) United States Patent
Ware et al.

(10) Patent No.: US 10,813,216 B2
(45) Date of Patent: Oct. 20, 2020

(54) LOAD REDUCED MEMORY MODULE

(71) Applicant: Rambus Inc., Sunnyvale, CA (US)

(72) Inventors: Frederick A. Ware, Los Altos Hills, CA (US); Suresh Rajan, San Jose, CA (US)

(73) Assignee: RAMBUS INC., San Jose, CA (US)

( * ) Notice: Subject to any disclaimer, the term of this patent is extended or adjusted under 35 U.S.C. 154(b) by 0 days.

(21) Appl. No.: 16/657,130

(22) Filed: Oct. 18, 2019

(65) Prior Publication Data

US 2020/0107441 A1 Apr. 2, 2020

Related U.S. Application Data

(63) Continuation of application No. 16/208,353, filed on Dec. 3, 2018, now Pat. No. 10,455,698, which is a
(Continued)

(51) Int. Cl.
*G11C 5/06* (2006.01)
*H05K 1/11* (2006.01)
(Continued)

(52) U.S. Cl.
CPC .............. *H05K 1/11* (2013.01); *G06F 1/184* (2013.01); *G06F 13/1694* (2013.01);
(Continued)

(58) Field of Classification Search
CPC .......... H05K 1/11; H05K 1/181; G06F 1/184; G06F 13/1694; G06F 13/4068;
(Continued)

(56) References Cited

U.S. PATENT DOCUMENTS 5,860,080 A 1/1999 James et al.
6,115,278 A 9/2000 Deneroff et al.
(Continued)

FOREIGN PATENT DOCUMENTS

CN 1728074 2/2006
WO WO-2008-127698 A2 10/2008

OTHER PUBLICATIONS

CN Office Action dated Feb. 24, 2018 re: CN Appln. No. 201480050405. 4. 15 Pages. (W/Translation).
(Continued)

*Primary Examiner* — Viet Q Nguyen
(74) *Attorney, Agent, or Firm* — Lowenstein Sandler LLP

(57) ABSTRACT

The embodiments described herein describe technologies for memory systems. One implementation of a memory system includes a motherboard substrate with multiple module sockets, at least one of which is populated with a memory module. A first set of data lines is disposed on the motherboard substrate and coupled to the module sockets. The first set of data lines includes a first subset of point-to-point data lines coupled between a memory controller and a first socket and a second subset of point-to-point data lines coupled between the memory controller and a second socket. A second set of data lines is disposed on the motherboard substrate and coupled between the first socket and the second socket. The first and second sets of data lines can make up a memory channel.

20 Claims, 23 Drawing Sheets

Related U.S. Application Data continuation of application No. 15/814,180, filed on Nov. 15, 2017, now Pat. No. 10,149,383, which is a continuation of application No. 14/515,380, filed on Oct. 15, 2014, now Pat. No. 9,826,638.

(60) Provisional application No. 61/891,331, filed on Oct. 15, 2013.

(51) Int. Cl.

| | |
|---|---|
| *G11C 11/4093* | (2006.01) |
| *H05K 1/18* | (2006.01) |
| *G06F 15/78* | (2006.01) |
| *G11C 11/408* | (2006.01) |
| *G06F 1/18* | (2006.01) |
| *G11C 5/04* | (2006.01) |
| *G11C 7/10* | (2006.01) |
| *G06F 13/16* | (2006.01) |
| *G06F 13/40* | (2006.01) |

(52) U.S. Cl.
CPC ...... *G06F 13/4068* (2013.01); *G06F 15/7803* (2013.01); *G11C 5/04* (2013.01); *G11C 5/06* (2013.01); *G11C 7/10* (2013.01); *G11C 11/4082* (2013.01); *G11C 11/4093* (2013.01); *H05K 1/181* (2013.01); *H05K 2201/10159* (2013.01); *H05K 2201/10189* (2013.01)

(58) Field of Classification Search
CPC ......... G06F 15/7803; G11C 5/04; G11C 5/06; G11C 7/10; G11C 11/4082; G11C 11/4093
USPC .................................................. 361/679.31
See application file for complete search history.

(56) References Cited

U.S. PATENT DOCUMENTS

| | | | |
|---|---|---|---|
| 6,405,296 B1 | 6/2002 | Barth et al. | |
| 6,618,791 B1 | 9/2003 | Dodd et al. | |
| 6,742,098 B1 | 5/2004 | Halbert et al. | |
| 6,889,304 B2 | 5/2005 | Perego et al. | |
| 7,296,129 B2 | 11/2007 | Gower et al. | |
| 7,379,316 B2 | 5/2008 | Rajan | |
| 7,493,439 B2 | 2/2009 | Gower et al. | |
| 7,539,800 B2 | 5/2009 | Dell et al. | |
| 7,577,789 B2 | 8/2009 | Perego et al. | |
| 8,089,795 B2 | 1/2012 | Rajan et al. | |
| 8,130,560 B1 | 3/2012 | Rajan et al. | |
| 8,169,233 B2 | 5/2012 | Ferolito et al. | |
| 8,264,903 B1 | 9/2012 | Lee et al. | |
| 8,275,936 B1 | 9/2012 | Haywood et al. | |
| 8,335,894 B1 | 12/2012 | Rajan et al. | |
| 8,432,768 B2 | 4/2013 | Ware et al. | |
| 8,539,145 B1* | 9/2013 | Warnes | G06F 13/1684 711/105 |
| 8,824,222 B2 | 9/2014 | Ware et al. | |
| 9,099,194 B2 | 8/2015 | Hampel et al. | |
| 9,165,639 B2* | 10/2015 | Ware | G11C 7/1051 |
| 9,171,585 B2 | 10/2015 | Rajan et al. | |
| 9,176,903 B2 | 11/2015 | Shaeffer et al. | |
| 9,183,920 B2 | 11/2015 | Ware et al. | |
| 9,232,651 B2* | 1/2016 | Ware | G06F 13/1694 |
| 9,489,323 B2 | 11/2016 | Amirkhany et al. | |
| 9,490,002 B2* | 11/2016 | Ware | G11C 11/40611 |
| 9,653,146 B2 | 5/2017 | Ware et al. | |
| 9,697,884 B2 | 7/2017 | Ware et al. | |
| 9,812,220 B2 | 11/2017 | Kim et al. | |
| 9,826,638 B2 | 11/2017 | Ware et al. | |
| 9,837,132 B2* | 12/2017 | Ware | G11C 5/04 |
| 10,074,417 B2* | 9/2018 | Ware | G11C 5/04 |
| 10,146,608 B2 | 12/2018 | Giovannini et al. | |
| 10,149,383 B2* | 12/2018 | Ware | G06F 13/1694 |
| 10,223,299 B2 | 3/2019 | Ware et al. | |
| 10,223,309 B2* | 3/2019 | Ware | G11C 5/025 |
| 10,409,742 B2* | 9/2019 | Ware | G06F 11/079 |
| 10,459,660 B2* | 10/2019 | Ware | G11C 5/04 |
| 2001/0028114 A1 | 10/2001 | Hosomi | |
| 2001/0051457 A1 | 12/2001 | MacLaren et al. | |
| 2003/0095057 A1 | 5/2003 | Gredone et al. | |
| 2003/0105932 A1 | 6/2003 | David et al. | |
| 2003/0174547 A1 | 9/2003 | Nakata et al. | |
| 2003/0204688 A1* | 10/2003 | Lee | G06F 13/1673 711/158 |
| 2004/0257847 A1 | 12/2004 | Matsui et al. | |
| 2005/0023560 A1* | 2/2005 | Ahn | G11C 29/48 257/200 |
| 2005/0166026 A1 | 7/2005 | Ware et al. | |
| 2006/0023482 A1 | 2/2006 | Dreps et al. | |
| 2006/0044860 A1* | 3/2006 | Kinsley | G11C 5/02 365/52 |
| 2006/0129755 A1 | 6/2006 | Raghuram | |
| 2006/0233012 A1 | 10/2006 | Sekiguchi et al. | |
| 2006/0236031 A1 | 10/2006 | Perego et al. | |
| 2006/0267172 A1 | 11/2006 | Nguyen et al. | |
| 2007/0006011 A1 | 1/2007 | Martin et al. | |
| 2007/0127304 A1 | 6/2007 | Yoon et al. | |
| 2007/0133247 A1 | 6/2007 | Lee et al. | |
| 2007/0260841 A1 | 11/2007 | Hampel et al. | |
| 2007/0286078 A1 | 12/2007 | Coteus et al. | |
| 2008/0080261 A1 | 4/2008 | Shaeffer et al. | |
| 2008/0084769 A1* | 4/2008 | RaghurRam | G06F 13/4243 365/191 |
| 2008/0094811 A1* | 4/2008 | Hazelzet | G11C 5/04 361/760 |
| 2008/0235444 A1* | 9/2008 | Gower | G11C 5/04 711/105 |
| 2009/0070522 A1 | 3/2009 | Poo | |
| 2009/0091963 A1 | 4/2009 | Patel | |
| 2009/0154212 A1* | 6/2009 | Park | G11C 5/04 365/51 |
| 2011/0208906 A1 | 8/2011 | Gillingham | |
| 2012/0047388 A1 | 2/2012 | Johnson | |
| 2012/0134084 A1 | 5/2012 | Perego et al. | |
| 2012/0204079 A1 | 8/2012 | Takefman et al. | |
| 2012/0250264 A1 | 10/2012 | Osanai et al. | |
| 2012/0300555 A1 | 11/2012 | Shin et al. | |
| 2012/0326775 A1 | 12/2012 | Heo | |
| 2013/0010556 A1 | 1/2013 | Koshizuka | |
| 2013/0033954 A1 | 2/2013 | Shaeffer | |
| 2013/0058145 A1 | 3/2013 | Yu et al. | |
| 2013/0063998 A1 | 3/2013 | Harashima | |
| 2013/0135916 A1 | 5/2013 | Osanai et al. | |
| 2013/0254495 A1 | 9/2013 | Kim et al. | |
| 2013/0301207 A1* | 11/2013 | Chun | H05K 1/117 361/679.32 |
| 2014/0268973 A1* | 9/2014 | Connolly | G11C 5/04 365/63 |
| 2015/0074346 A1 | 3/2015 | Luo et al. | |
| 2015/0106560 A1 | 4/2015 | Perego et al. | |
| 2015/0131388 A1 | 5/2015 | Ware et al. | |
| 2016/0217839 A1* | 7/2016 | Ware | G11C 5/04 |
| 2016/0276016 A1 | 9/2016 | Benedict | |

OTHER PUBLICATIONS

Communication Pursuant to Rule 164(2)(b) and Article 94(3) EPC dated Jul. 29, 2019 re: EP Appln. No. 14795714.6. 9 Pages.
EP Communication Under Rule 164(2)(a) EPC dated Apr. 25, 2019 re: EP Appln. No. 14795714.6. 4 Pages.
Notification Concerning Transmittal of International Preliminary Report on Patentability dated Apr. 28, 2016 re Int'l Appln. No. PCT/US2014/060737. 11 Pages.
PCT International Search Report & Written Opinion re PCT/US2014/060737 dated Mar. 20, 2015. 15 pages.
PCT International Search Report and the Written Opinion re PCT/US2014/065083 dated Feb. 9, 2015. 9 pages.

(56) References Cited

OTHER PUBLICATIONS

PCT International Search Report and Written Opinion dated Dec. 24, 2014 in International Application No. PCT/US2014/057314. 15 pages.

* cited by examiner

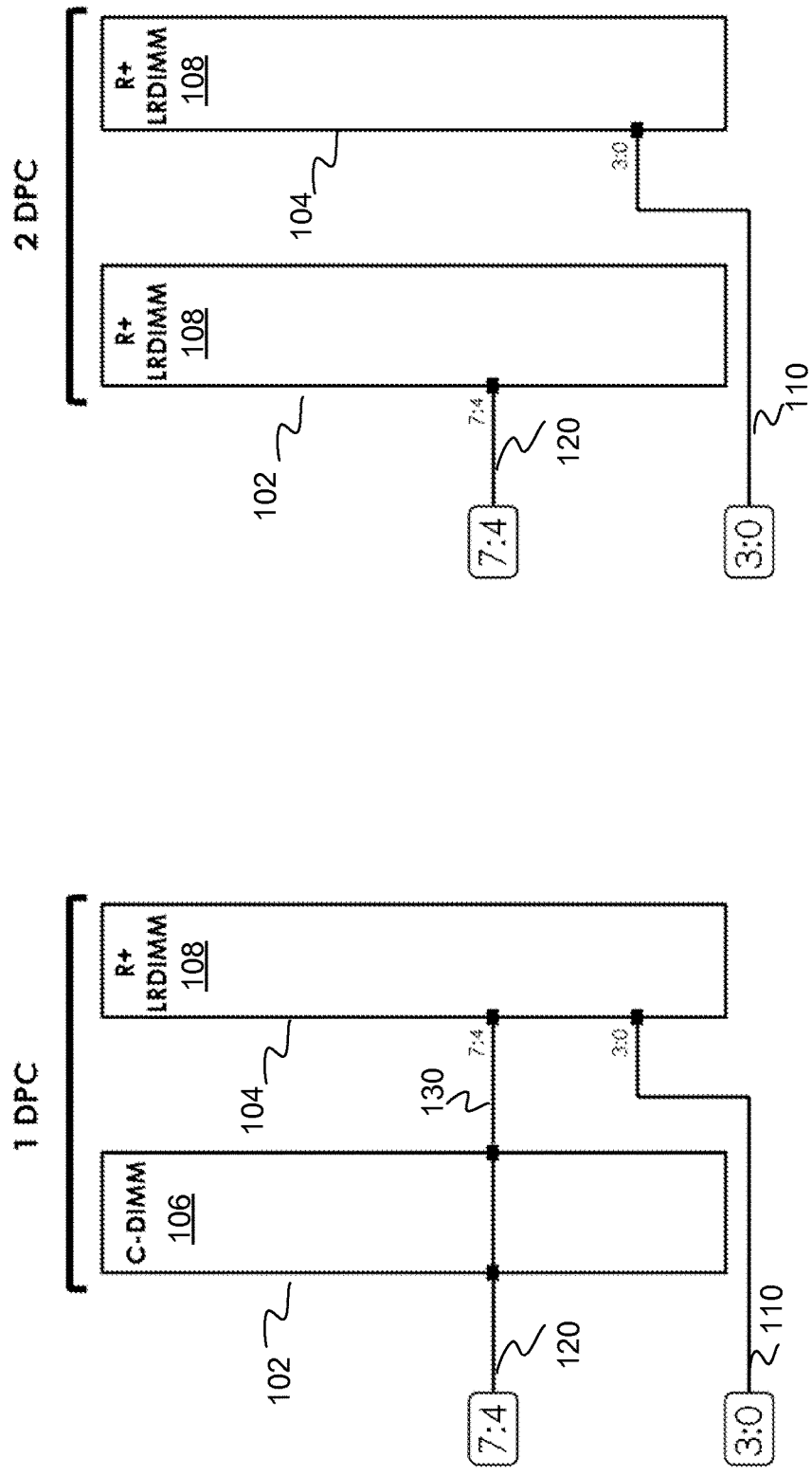

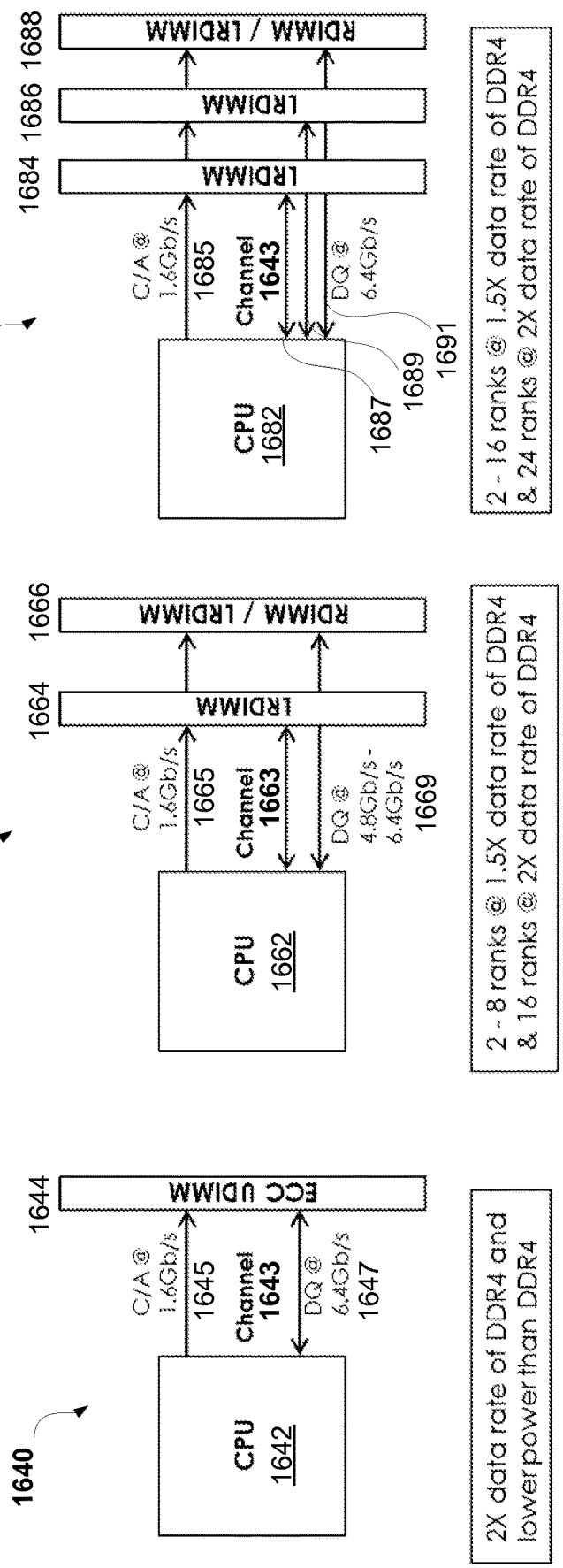

LOAD REDUCED MEMORY MODULE

RELATED APPLICATIONS

This application is a continuation application of U.S. patent application Ser. No. 16/208,353, filed on Dec. 3, 2018, which is a continuation application of U.S. patent application Ser. No. 15/814,180, filed on Nov. 15, 2017, now U.S. Pat. No. 10,149,383, which is a continuation application of U.S. patent application Ser. No. 14/515,380, filed on Oct. 15, 2014, now U.S. Pat. No. 9,826,638, which claims the benefit of U.S. Provisional Application No. 61/891,331, filed Oct. 15, 2013, the entire contents of all are incorporated by reference. This application is related to U.S. Pat. No. 9,232,651, issued Jan. 5, 2016.

BACKGROUND

Computing memory systems are generally composed of one or more dynamic random access memory (DRAM) integrated circuits, referred to herein as DRAM devices, which are connected to one or more processors. Multiple DRAM devices may be arranged on a memory module, such as a dual in-line memory module (DIMM). A DIMM includes a series of DRAM devices mounted on a printed circuit board (PCB) and are typically designed for use in personal computers, workstations, servers, or the like. There are different types of memory modules, including a load-reduced DIMM (LRDIMM) for Double Data Rate Type three (DDR3), which have been used for large-capacity servers and high-performance computing platforms. Memory capacity may be limited by the loading of the data (DQ) bus and the request (RQ) bus associated with the user of many DRAM devices and DIMMs. LRDIMMs may increase memory capacity by using a memory buffer component (also referred to as a register). Registered memory modules have a register between the DRAM devices and the system's memory controller. For example, a fully buffer-componented DIMM architecture introduces an advanced memory buffer component (AMB) between the memory controller and the DRAM devices on the DIMM. The memory controller communicates with the AMB as if the AMB were a memory device, and the AMB communicates with the DRAM devices as if the AMB were a memory controller. The AMB can buffer component data, command and address signals. With this architecture, the memory controller does not write to the DRAM devices, rather the AMB writes to the DRAM devices Lithographic feature size has steadily reduced as each successive generation of DRAM has appeared in the marketplace. As a result, the device storage capacity of each generation has increased. Each generation has seen the signaling rate of interfaces increase, as well, as transistor performance has improved.

Unfortunately, one metric of memory system design which has not shown comparable improvement is the module capacity of a standard memory channel. This capacity has steadily eroded as the signaling rates have increased.

Part of the reason for this is the link topology used in standard memory systems. When more modules are added to the system, the signaling integrity is degraded, and the signaling rate must be reduced. Typical memory systems today are limited to just two or three modules when operating at the maximum signaling rate.

BRIEF DESCRIPTION OF THE DRAWINGS

The present disclosure is illustrated by way of example, and not by way of limitation, in the figures of the accompanying drawings.

FIG. 1A is a diagram illustrating two-socket per channel (2-SPC) memory channel wiring with 1 R+LRDIMM in a 1 DPC memory configuration according to one embodiment.

FIG. 1B is a diagram illustrating 2-SPC memory channel wiring with 2 R+LRDIMMs in a 2 DPC memory configuration according to one embodiment.

FIG. 16C is a diagram illustrating a first server memory configuration with a CPU and a 1-SPC memory channel with one DIMM slot populated with one or more beyond-DDR4 DRAM devices according to one embodiment.

FIG. 16D is a diagram illustrating a second server memory configuration with a CPU and a 2-SPC memory channel with two DIMM slots populated with one or two R+LRDIMMs with beyond-DDR4 DRAM devices according to one embodiment.

FIG. 16E is a diagram illustrating a third server memory configuration with a CPU and a 3-SPC memory channel with three DIMM slots populated with one, two or three R+LRDIMMs with beyond-DDR4 DRAM devices according to one embodiment.

DETAILED DESCRIPTION

Figures 2A, 2B:
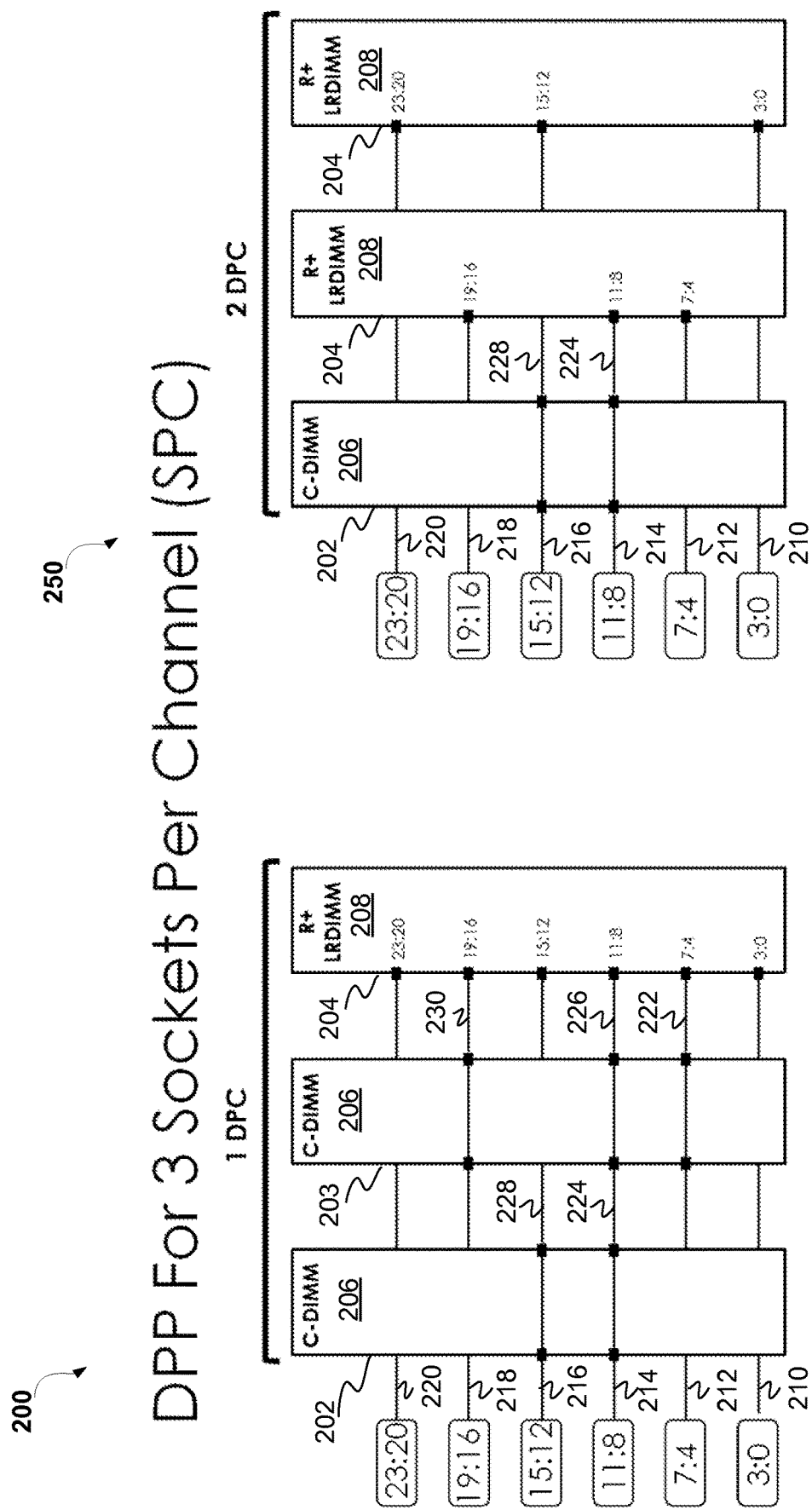
FIG. 2A is a diagram illustrating 3-SPC memory channel wiring with 1 R+LRDIMM in a 1 DPC memory configuration according to one embodiment.
FIG. 2B is a diagram illustrating 3-SPC memory channel wiring with 2 R+LRDIMMs in a 2 DPC memory configuration according to one embodiment.

The embodiments described herein describe technologies for memory systems. One implementation of a memory system includes a motherboard substrate with multiple module sockets, one of which is populated with a memory module. A first set of data lines is disposed on the motherboard substrate and coupled to the module sockets. The first set of data lines include a first subset of point-to-point data lines coupled between a memory controller and a first socket and a second subset of point-to-point data lines coupled between the memory controller and a second socket. The first set of data lines may also include a third subset of point-to-point data lines coupled between the memory controller and a third socket. A second set of data lines is disposed on the motherboard substrate and coupled between the first socket and the second socket. The second set of data lines may also include a fourth subset of data lines coupled between the first socket and the second socket and a fifth subset of data lines coupled between the first socket and the third socket. The first and second sets of data lines can make up a memory channel and the memory channel can be a one socket per channel (SPC) memory channel, a 2-SPC memory channel, or a 3-SPC channel when there are three module sockets. Module sockets are also described herein as slots of a motherboard substrate. Thus, sockets and slots are used interchangeably in the description. Also, nibbles as used herein may include four wires of data signals (with one bit on each wire during each bit interval) and two wires of timing signals (with a differential timing event per bit interval). Various embodiments are directed to DIMMS that are greater than 64-bits, such as 72-bit wide DIMMs that support ECC, such as used in server memory systems.

Description of various embodiments herein are described with respect to memory systems with up to three R+ DDR4 LRDIMMs that can be operated at 3 DIMMs per channel (DPC) at 3.2 Gb/s using Dynamic Point-Point (DPP) as described herein. Some embodiments do not require change to DRAM devices themselves and a central processing unit (CPU), but may include changes in a module interface and buffer components of the module and changes to a motherboard. The R+ DDR4 LRDIMMs described herein are compatible with the DDR4 LRDIMM standard. The R+ DDR4 LRDIMMs support various error correction coding (ECC) techniques, including single error correcting and, simultaneously, double error detecting (SEC-DED), as well as the ChipKill™ ECC computer memory technology or other advanced ECC computer memory technologies. The embodiments of R+ DDR4 LRDIMMs described herein do not need dynamic on-die termination (ODT) and may have the same or lower power than standard LRDIMMs. The embodiments of R+ LRDIMM architecture, as described herein, may be scale to beyond-DDR4 data rates, e.g., up to 6.4 Gb/s in one embodiment. The embodiments described herein can be used in a memory system where a primary bus can be run at a higher rate and may only be limited by the speed of transfers.

Embodiments of a motherboard are also described herein. In some embodiments, the motherboard can enable 3 DPC at maximum data rates. The R+ DDR4 LRDIMMs can also be used in standard motherboards and behave like standard LRDIMMs in those implementation. In other embodiment where interoperability with standard motherboards is not needed, then R+ LRDIMMs can be developed with lower cost than standard LRDIMM as described in more detail below.

Embodiments of memory modules can also be inserted in sockets of a memory system in different configurations. The R+ LRDIMMs may be built from standard memory components. Standard memory controller components (with minimal modifications) and new memory modules may be used in standard memory systems or in new LRDIMM memory systems. The minimal modifications may be that the memory controllers are configured to send appropriate control information given the different configurations. The embodiments of R+ DDR4 LRDIMMs are described as being deployed using DPP. DPP ensures that all data (DQ) nets in a memory channel are always point-to-point, irrespective of the memory configuration (e.g., 1-SPC, 2-SPC, or 3-SPC). Eliminating the multi-drop topology of DQ nets may reduce reflections and other inter-symbol-interference USD effects, thus allowing higher data rates. In some memory configurations, DPP uses one or more continuity DIMMs (CDIMMs). A CDIMM is a printed circuit board (PCB) (e.g., a FR-4 board) with no active or passive components and includes traces that short one set of DQ pins to another set of DQ pins.

FIGS. 1A-1B are diagrams illustrating 2-SPC memory channel wirings for a 1 DPC memory configuration 100 and a 2 DPC memory configuration 150, respectively.

FIG. 1A is a diagram illustrating 2-SPC memory channel wiring with 1 R+LRDIMM in a 1 DPC memory configuration 100 according to one embodiment. In the 1 DPC memory configuration 100, a first slot 102 is populated with a continuity module (C-DIMM) 106 and a second slot 104 is populated with a R+LRDIMM 108. FIG. 1A illustrates an 8-bit slice of a 72-bit wide DIMM architecture, including a first nibble received by the R+LRDIMM 108 at the second slot 104 on data lines 110 and a second nibble received by the C-DIMM 106 at the first slot 102 on data lines 120 and routed to the R+LRDIMM 108 at the second slot 104 on data lines 130.

FIG. 1B is a diagram illustrating 2-SPC memory channel wiring with 2 R+LRDIMMs in a 2 DPC memory configuration 150 according to one embodiment. The 2-SPC memory channel wiring is similar in the 1 DPC memory configuration 100 is similar to the 2-SPC memory channel wiring in the 2 DPC memory configuration 150 as noted by similar reference labels. In the 2 DPC memory configuration 150, the first slot 102 is populated with a first R+LRDIMM 108 and the second slot 104 is populated with a second R+LRDIMM 108. Since both the first slot 102 and the second slot 104 are populated with R+LDIMMs 108, the data lines 130 are not used and the first nibble is received by the second R+LRDIMM 108 at the second slot 104 on data lines 110 and the second nibble is received by the first R+LRDIMM 108 at the first slot 102 on data lines 120. Although one 8-bit slice of the 72-bit wide DIMM is illustrated in FIGS. 1A-1B, the other slices of the 72-bit wide DIMM architecture may be identical. It should also be noted that the embodiments above describe receiving nibbles at the C-DIMM 106 and R+LRDIMM 108, but it would be understood that the nibbles can also be sent by the LRDIMM 108 to a memory controller on the data lines, some of which would pass through the C-DIMM 106.

Figure 2C:
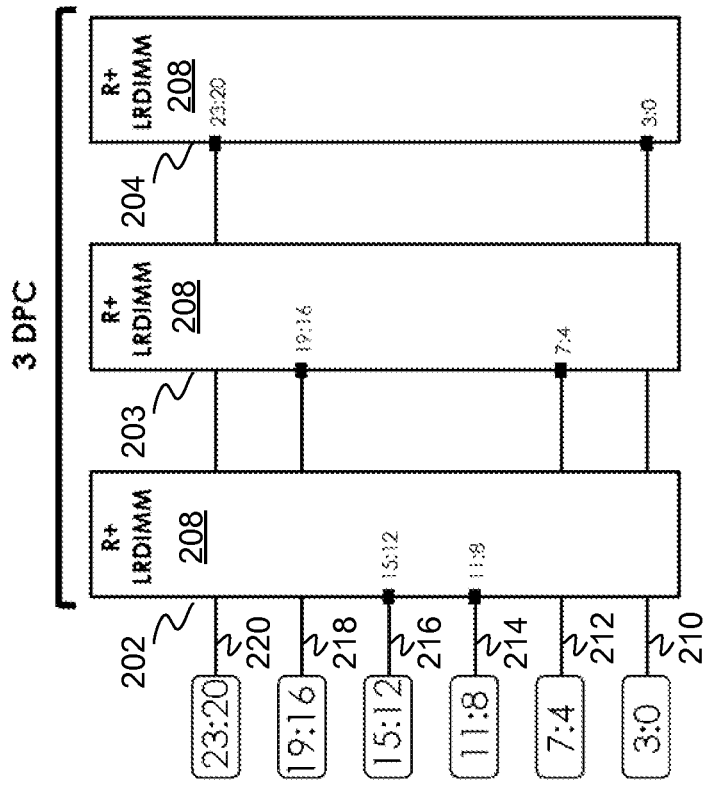
FIG. 2C is a diagram illustrating 3-SPC memory channel wiring with 3 R+LRDIMMs in a 3 DPC memory configuration according to one embodiment.

FIGS. 2A-2C are diagrams illustrating 3-SPC memory channel wirings for a 1 DPC memory configuration 200, a 2 DPC memory configuration 250, and a 3 DPC memory configuration 260, respectively.

FIG. 2A is a diagram illustrating 3-SPC memory channel wiring with 1 R+LRDIMM in a 1 DPC memory configuration 200 according to one embodiment. In the 1 DPC memory configuration 200, a first slot 202 is populated with a first C-DIMM 206, a second slot 203 is populated with a second C-DIMM 206, and a third slot 204 is populated with a R+LRDIMM 208. FIG. 2A illustrates an 24-bit slice of a 72-bit wide DIMM architecture, including: 1) a first nibble received by the R+LRDIMM 108 at the third slot 204 on data lines 210; 2) a second nibble received by the second C-DIMM 206 at the second slot 203 on data lines 212 and routed to the R+LRDIMM 208 at the third slot 204 on data lines 222, 3) a third nibble received by the first C-DIMM 206 at the first slot 202 on data lines 214, routed to the second C-DIMM 206 at the second slot 203 on data lines 224, and routed to the R+LRDIMM 208 at the third slot 204 on data lines 226; 4) a fourth nibble received by the first C-DIMM 206 at the first slot 202 on data lines 216 and routed to the R+LRDIMM 208 at the third slot 204 on data lines 228; 5) a fifth nibble received by the second C-DIMM 206 at the second slot 203 on data lines 218 and routed to the R+LRDIMM 208 at the third slot 204 on data lines 230; and 6) a sixth nibble received by the R+LRDIMM 208 at the third slot 204 on data lines 220.

FIG. 2B is a diagram illustrating 3-SPC memory channel wiring with 2 R+LRDIMMs in a 2 DPC memory configuration 250 according to one embodiment. The 3-SPC memory channel wiring in the 1 DPC memory configuration 200 is similar to the 3-SPC memory channel wiring in the 2 DPC memory configuration 250 as noted by similar reference labels. In the 2 DPC memory configuration 250, the first slot 202 is populated with a C-DIMM 206, the second slot 203 is populated with a first R+LRDIMM 208 and the third slot 1204 is populated with a second R+LRDIMM 208. Since both the second slot 203 and the third slot 204 are populated with R+LDIMMs 208, the data lines 222, 226 and 230 are not used, but the data lines 224 and 228 are still used since the first slot 202 is populated with the C-DIMM 206.

FIG. 2C is a diagram illustrating 3-SPC memory channel wiring with 3 R+LRDIMMs in a 3 DPC memory configuration 260 according to one embodiment. The 3-SPC memory channel wiring in the 1 DPC memory configuration 250 is similar to the 3-SPC memory channel wiring in the 2 DPC memory configuration 260 as noted by similar reference labels. In the 2 DPC memory configuration 260, the first slot 202 is populated with a first R+LRDIMM 208, the second slot 203 is populated with a second R+LRDIMM 208 and the third slot 1204 is populated with a third R+LRDIMM 208. Since the first slot 202, second slot 203, and third slot 204 are populated with R+LDIMMs 208, the data lines 222, 224, 226, 228 and 230 are not used. Although one 24-bit slice of the 72-bit wide DIMM is illustrated in FIGS. 2A-2C, the other slices of the 72-bit wide DIMM architecture may be identical. It should also be noted that the embodiments above describe receiving nibbles at the C-DIMM 206 and R+LRDIMM 208, but it would be understood that the nibbles can also be sent by the LRDIMM 208 to a memory controller on the data lines, some of which would pass through the C-DIMM 206.

Figure 3:
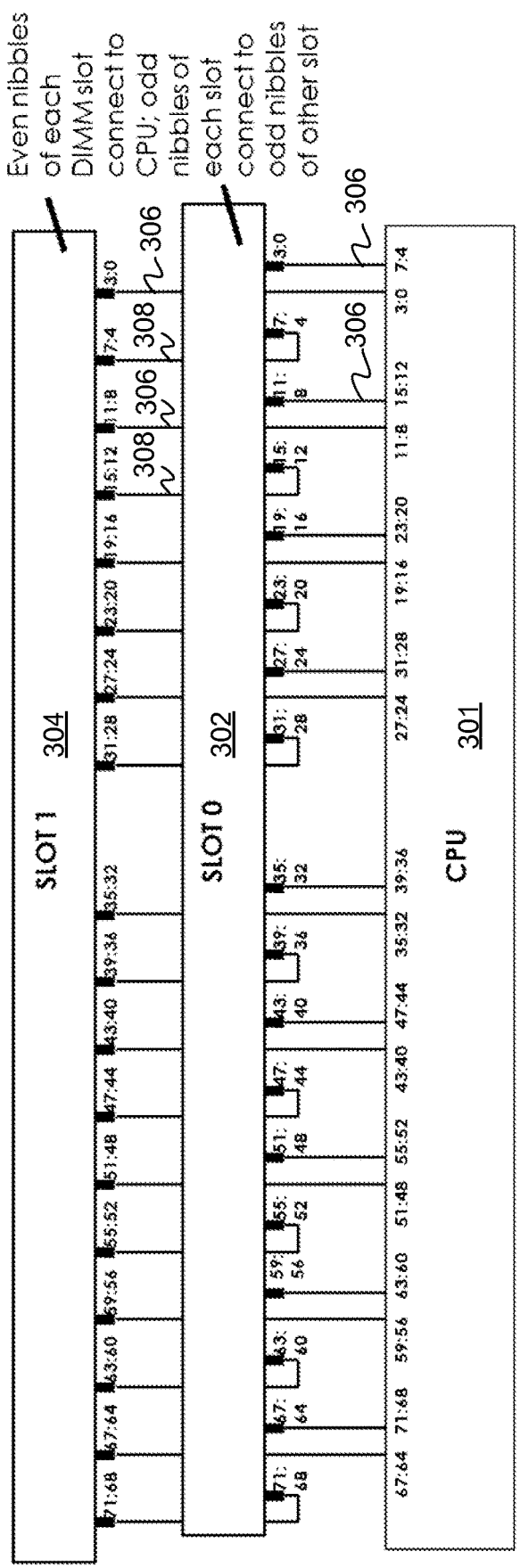
FIG. 3 is a diagram illustrating 2-SPC memory channel wiring with a central processing unit (CPU) slot and two DIMM slots for R+LRDIMMs coupled to the CPU slot with data lines according to even and odd nibbles according to one embodiment.

FIG. 3 is a diagram illustrating 2-SPC memory channel wiring 300 with a CPU slot 301 and two DIMM slots 302, 304 for R+LRDIMMs coupled to the CPU slot 301 with data lines according to even and odd nibbles according to one embodiment. A first set of data lines 306, corresponding to even nibbles, are connected to the DIMM slots 302, 304 and the CPU slot 301. A second set of data lines 308, corresponding to odd nibbles, are connected between the two DIMM slots 302, 304. That is odd nibbles of one DIMM slot is coupled to odd nibbles of the other DIMM slot. The first and second sets of data lines 306, 308 can accommodate 9 even nibbles and 9 odd nibbles for a 72-bit wide DIMM in 1 DPC or 2 DPC memory configurations, as described below with respect to FIGS. 4A-4B.

Figure 4A:
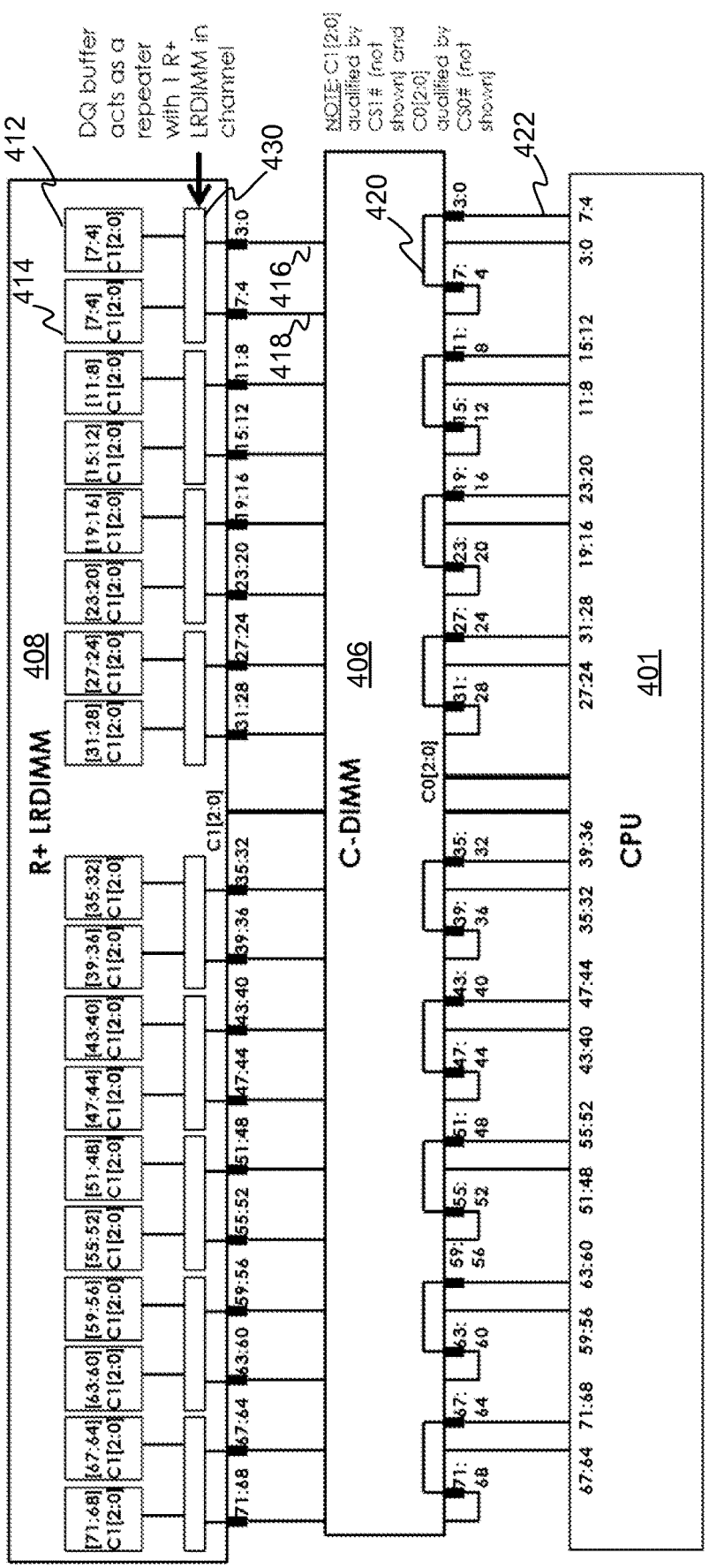
FIG. 4A is a diagram illustrating 2-SPC double data rate fourth generation (DDR4) channel with one DIMM slot populated with one R+LRDIMM and another DIMM slot populated with a continuity DIMM (C-DIMM) according to one embodiment.

FIG. 4A is a diagram illustrating 2-SPC DDR4 channel 400 with one DIMM slot populated with one R+LRDIMM 408 and another DIMM slot populated with a continuity DIMM (C-DIMM) 406 according to one embodiment. The R+LRDIMM 408 includes eighteen device sites, where each site may be a single memory component or multiple memory components. For ease of description, the data lines of two devices sites 412, 414 in the 2-SPC DDR4 channel 400 are described. A first device site 412 is coupled to the CPU 401 via data lines 416 (even nibble). A second device site 414 is coupled to the C-DIMM 406 via data lines 418 (odd nibble of R+LRDIMM to odd nibble of C-DIMM). The C-DIMM 406 use internal traces 420 to couple the data lines 418 to data lines 422, which are coupled to the CPU 401 (odd nibble).

In FIG. 4A, a DQ buffer component 430 is coupled between the first device site 412 and second device site 414 and the data lines 416 and 418, respectively. The DQ buffer component 430 acts as a repeater with one R+LRDIMM 408 in the 2-SPC DDR4 channel 400. It should be noted that C1[2:0] is qualified by CS1# (not illustrated in FIG. 4A) and C0[2:0] is qualified by CS0# (not illustrated in FIG. 4B).

Figure 4B:
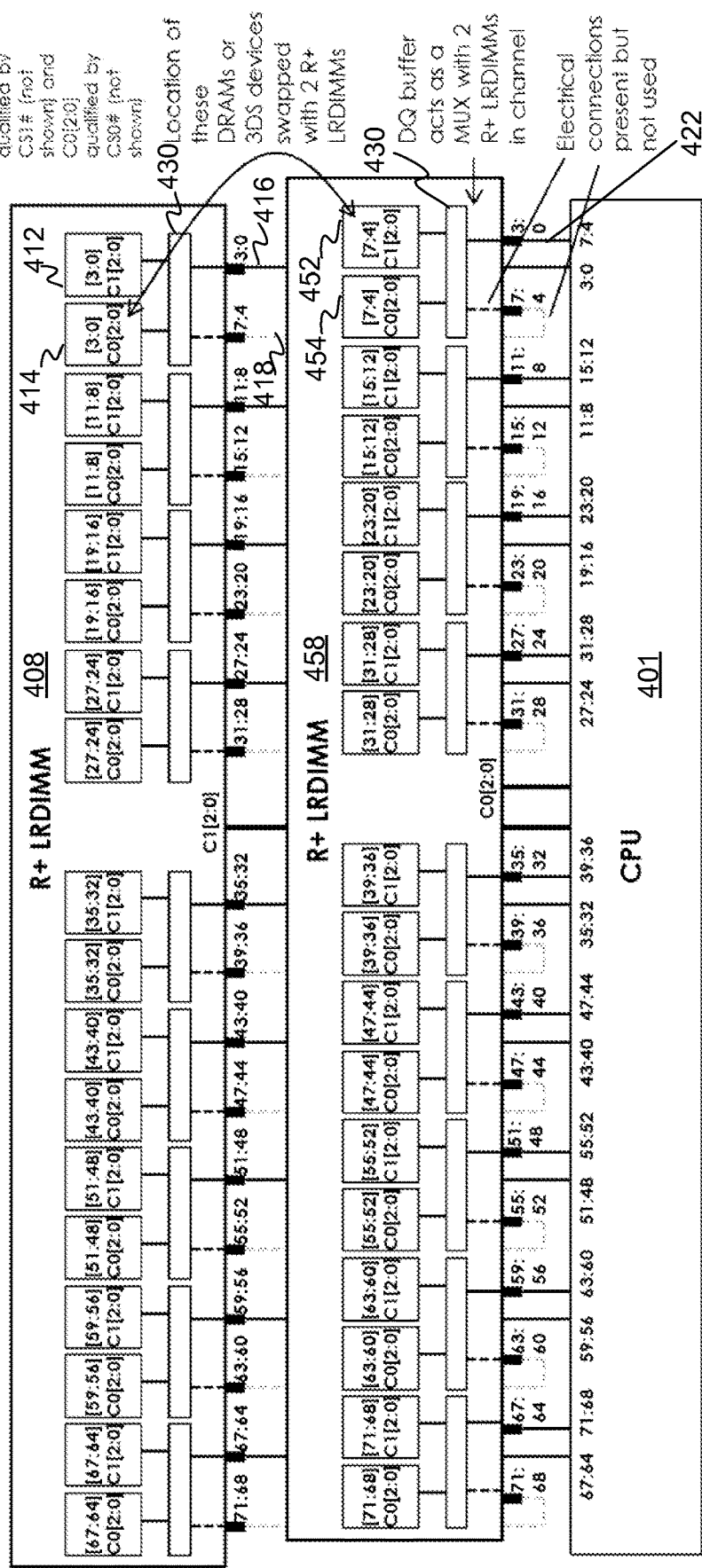
FIG. 4B is a diagram illustrating 2-SPC DDR4 channel with one DIMM slot populated with one R+LRDIMM and another DIMM slot populated with another one R+LRDIMM according to one embodiment.

FIG. 4B is a diagram illustrating 2-SPC DDR4 channel 450 with one DIMM slot populated with one R+LRDIMM 408 and another DIMM slot populated with another one R+LRDIMM 408 according to one embodiment. The 2-SPC DDR4 channel 450 is similar to the 2-SPC DDR channel 400 as noted by similar reference labels. However, the other slot is populated with a second R+LRDIMM 458. The R+LRDIMM 458 includes eighteen device sites, where each site may be a single memory component or multiple memory components. For ease of description, the data lines of two devices sites 412, 452 in the 2-SPC DDR4 channel 450 are described. A first device site 412 is coupled to the CPU 401 via data lines 416 (even nibble) as described above with respect to 2-SPC DDR4 channel 400. A second device site 452 is coupled to the CPU 401 via data lines 422 (even nibble). In effect, location of the second device site 414 of the 2-SPC DDR4 channel 400 is swapped with the first device site 452 of 2-SPC DDR4 channel 450 when both slots are populated with R+LRDIMMs 408, 458. It should be noted that the electrical connections for data lines 418 and internal data lines to the DQ buffer components are present on the motherboard and R+LDIMMs, but are not used.

In FIG. 4B, the DQ buffer component 430 acts as a multiplexer (MUX) with two R+LRDIMMs 408, 458 in the 2-SPC DDR4 channel 450. It should be noted that C1[2:0] is qualified by CS1# (not illustrated in FIG. 4A) and C0[2:0] is qualified by CS0# (not illustrated in FIG. 4B).

Figure 5:
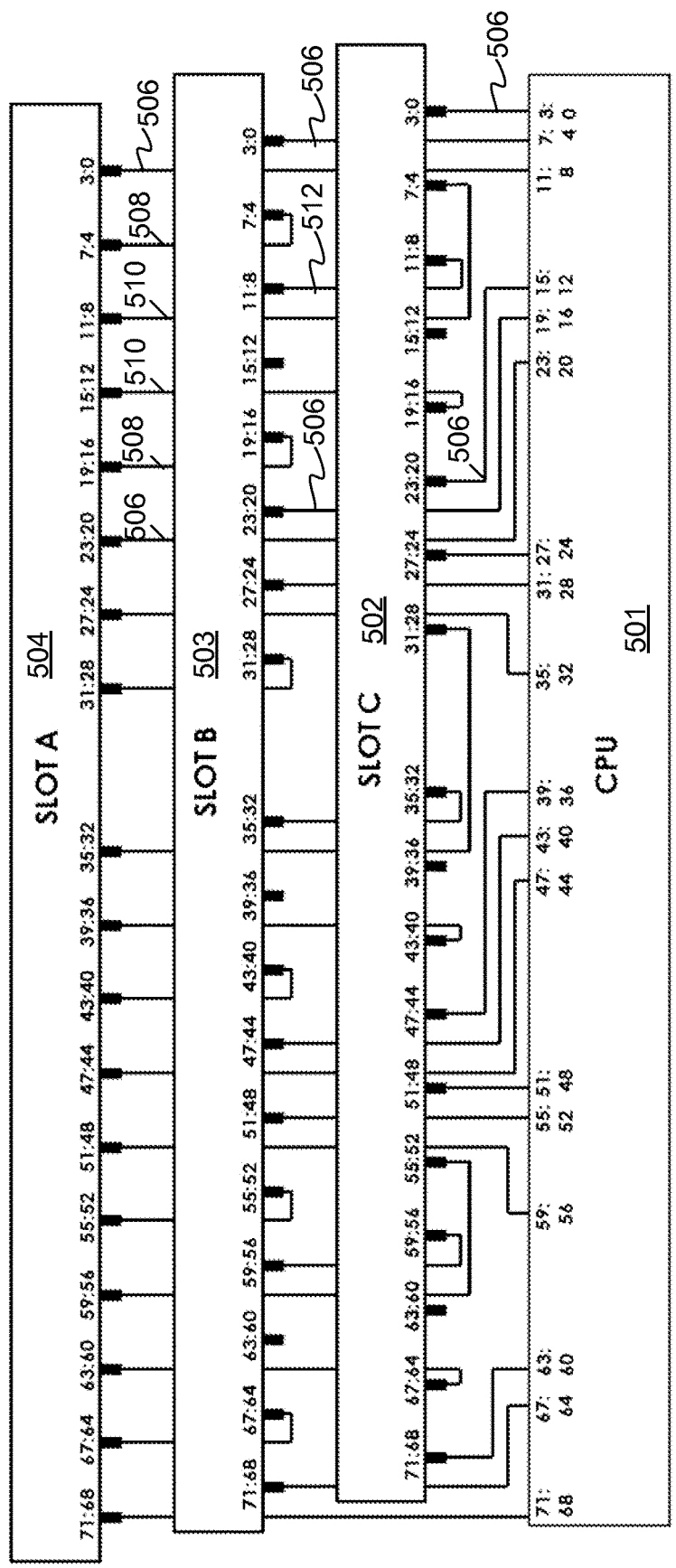
FIG. 5 is a diagram illustrating 3-SPC memory channel wiring 500 with a CPU slot and three DIMM slots for R+LRDIMMs coupled to the CPU slot with data lines according to sets of nibbles according to one embodiment.

FIG. 5 is a diagram illustrating 3-SPC memory channel wiring 500 with a CPU slot 501 and three DIMM slots 502-504 for R+LRDIMMs coupled to the CPU slot 501 with data lines according to sets of nibbles according to one embodiment. A first set of data lines 506 of the three DIMM slot 502-504 are connected to CPU slot 501. A second set of data lines 508 are connected between the second and third DIMM slots 503-504. A third set of data lines 510 are connected between the first and third DIMM slots 502, 504. A fourth set of data lines 512 are connected between the first and second DIMM slots 502, 503. The data lines for only one 24-bit wide slice are labeled, but the first, second, third, and fourth sets of data lines can accommodate eighteen nibbles for 1 DPC, 2 DPC, and 3 DPC memory configurations, as described below with respect to FIGS. 6A-6C.

Figure 6A:
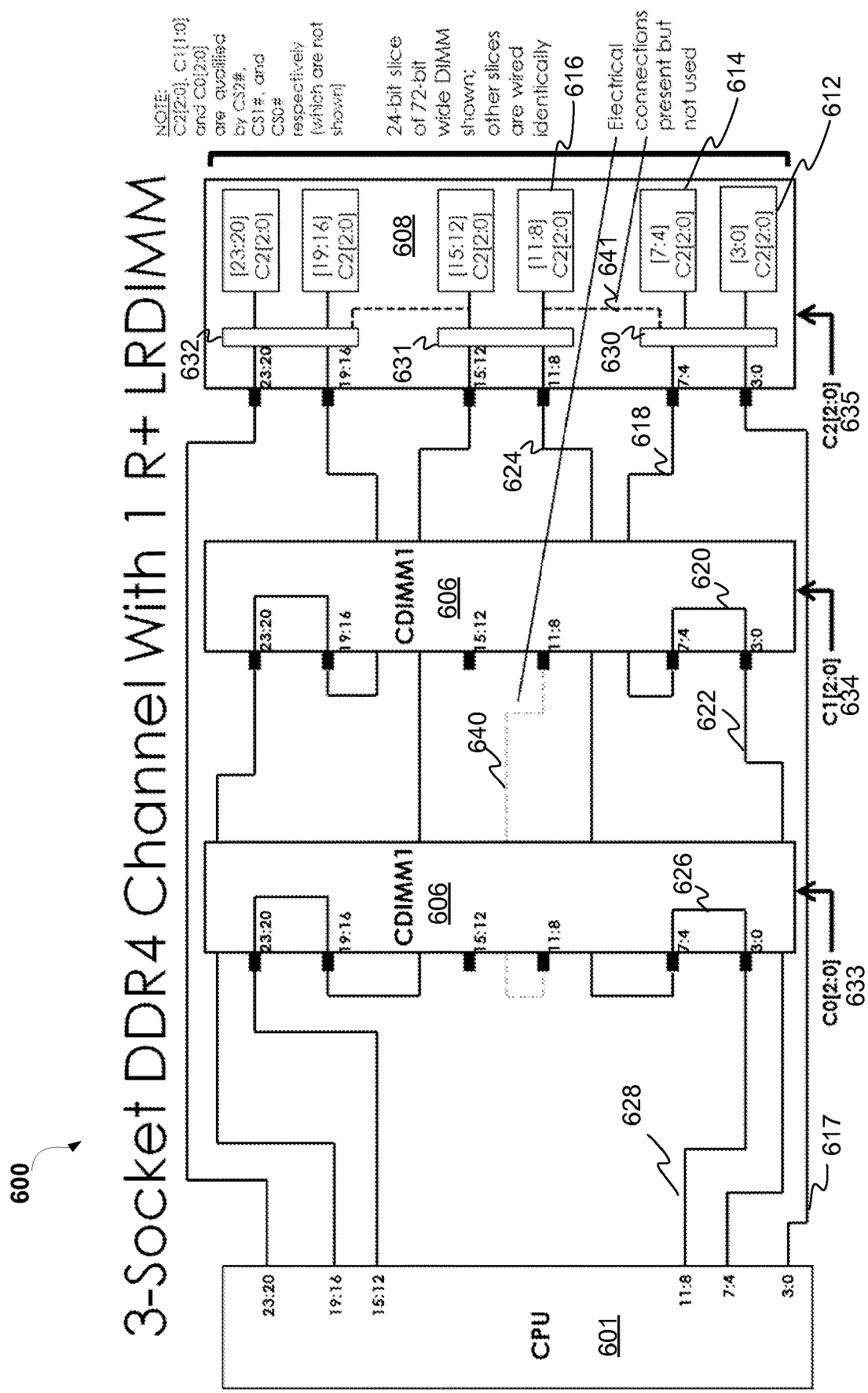
FIG. 6A is a diagram illustrating 3-SPC DDR4 channel with one DIMM slot populated with one R+LRDIMM and two DIMM slots populated with C-DIMMs according to one embodiment.

FIG. 6A is a diagram illustrating 3-SPC DDR4 channel 600 with one DIMM slot populated with one R+LRDIMM 608 and two DIMM slots populated with C-DIMMs 606 according to one embodiment. A 24-bit slice of a 72-bit wide DIMM is illustrated, but other slices are wired identically. The slice of R+LRDIMM 408 includes six device sites, where each site may be a single memory component or multiple memory components. For ease of description, the data lines of three devices sites 612, 614, 616 in the 3-SPC DDR4 channel 600 are described. A first device site 612 is coupled to the CPU 601 via data lines 617 (first nibble). A second device site 614 is coupled to the second C-DIMM 606 in the second slot via data lines 618, and the inner traces 620 of second C-DIMM 606 connect data lines 618 to data lines 622, which are coupled to the CPU 601 (second nibble). A third device site 616 is coupled to the first C-DIMM 606 in the first slot via data lines 624, and the inner traces 626 of first C-DIMM 606 connect data lines 624 to data lines 624, which are coupled to the CPU 601 (third nibble). Similar data lines can be used to connect the other device sites of the R+LRDIMM 608 to the CPU 601 for the other three nibbles in the slice. The DQ buffer component 632, with or without DQ buffer component 631, can be used for the other device sites of the R+LRDIMM 608.

In FIG. 6A, a DQ buffer component 630 is coupled between the first device site 612 and second device site 614 and the data lines 617 and 618, respectively. A second DQ buffer component 631 is coupled between the third device site 616 and data lines 624. In another embodiment, the DQ buffer component 630 is coupled to the three device sites 612-616 and the third device site 616 is coupled to the DQ buffer component 630 via data lines 641. Electrical connections may be presented for data lines 640 between the first and second C-DIMMS 606, but may be unused. Similarly, electrical connections may be presented for the data lines 641, but may be unused in some embodiments. The DQ buffer component 630 acts as a repeater with one R+LRDIMM 608 in the 3-SPC DDR4 channel 600. The DQ buffer component 630 could also act as multiplexer in some cases. It should be noted that C2[2:0], C1[2:0] and C0[2:0] are qualified by CS2#, CS1#, and CS0#, respectively (not illustrated in FIG. 6A).

Figure 6B:
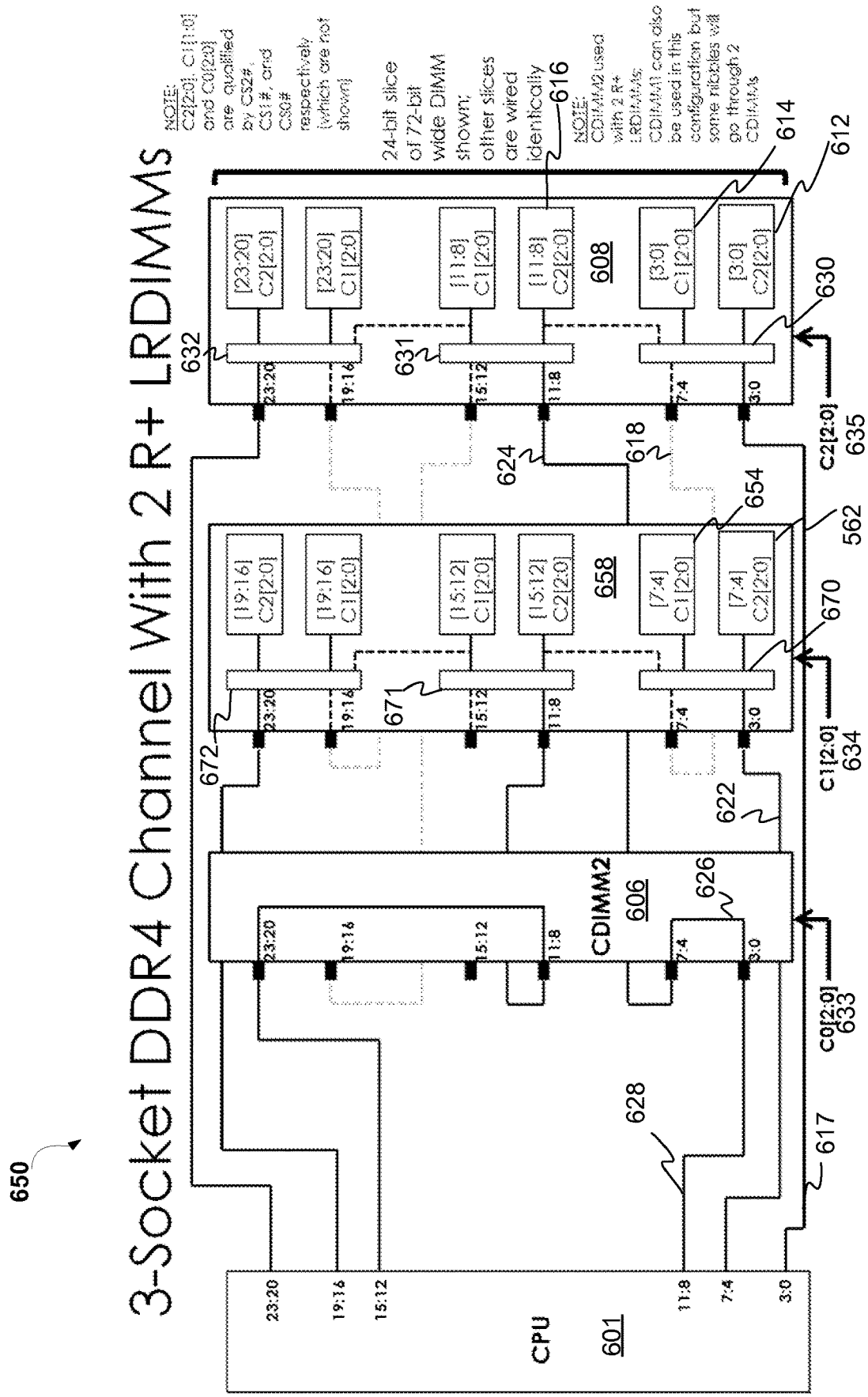
FIG. 6B is a diagram illustrating 3-SPC DDR4 channel with two DIMM slots populated with R+LRDIMMs and another DIMM slot populated with a C-DIMM according to one embodiment.

FIG. 6B is a diagram illustrating 3-SPC DDR4 channel 650 with two DIMM slots populated with R+LRDIMMs 608, 658 and another DIMM slot populated with a C-DIMM 606 according to one embodiment. The 3-SPC DDR4 channel 650 is similar to the 3-SPC DDR channel 600 as noted by similar reference labels. However, the second slot is populated with a second R+LRDIMM 658. The corresponding slice of the R+LRDIMM 658 includes six device sites, where each site may be a single memory component or multiple memory components. For ease of description, the data lines of three devices sites 612-616 in the 3-SPC DDR4 channel 650 are described. A first device site 612 is coupled to the CPU 401 via data lines 617 (first nibble) as described above with respect to 3-SPC DDR4 channel 600. A second device site 652 is coupled to the CPU 401 via data lines 622 (second nibble). A third device site 616 is coupled to the CPU via data lines 624, which are coupled to the first slot with the C-DIMM 606. The internal traces of the C-DIMM 606 connect the data lines 624 to the data lines 628 (third nibble). In effect, location of the second device site 614 of the 3-SPC DDR4 channel 600 is swapped with the first device site 452 of 3-SPC DDR4 channel 650 when both slots are populated with R+LRDIMMs 608, 658. It should be noted that the electrical connections for data lines 618 and internal data lines to the DQ buffer components are present on the motherboard and R+LDIMMs, but are not used. Similar data lines can be used to connect the other device sites of the two R+LRDIMMs 608, 658 to the CPU 601 for the other three nibbles in the slice. The DQ buffer components 630-632 and DQ buffer components 670-672 may be used for the device sites of the two R+LRDIMMs 608, 658. In some cases, the DQ buffer components may act as repeaters or multiplexers as described herein. It should be noted that C2[2:0], C1[2:0] and C0[2:0] are qualified by CS2#, CS1#, and CS0#, respectively (not illustrated in FIG. 6B).

Figure 6C:
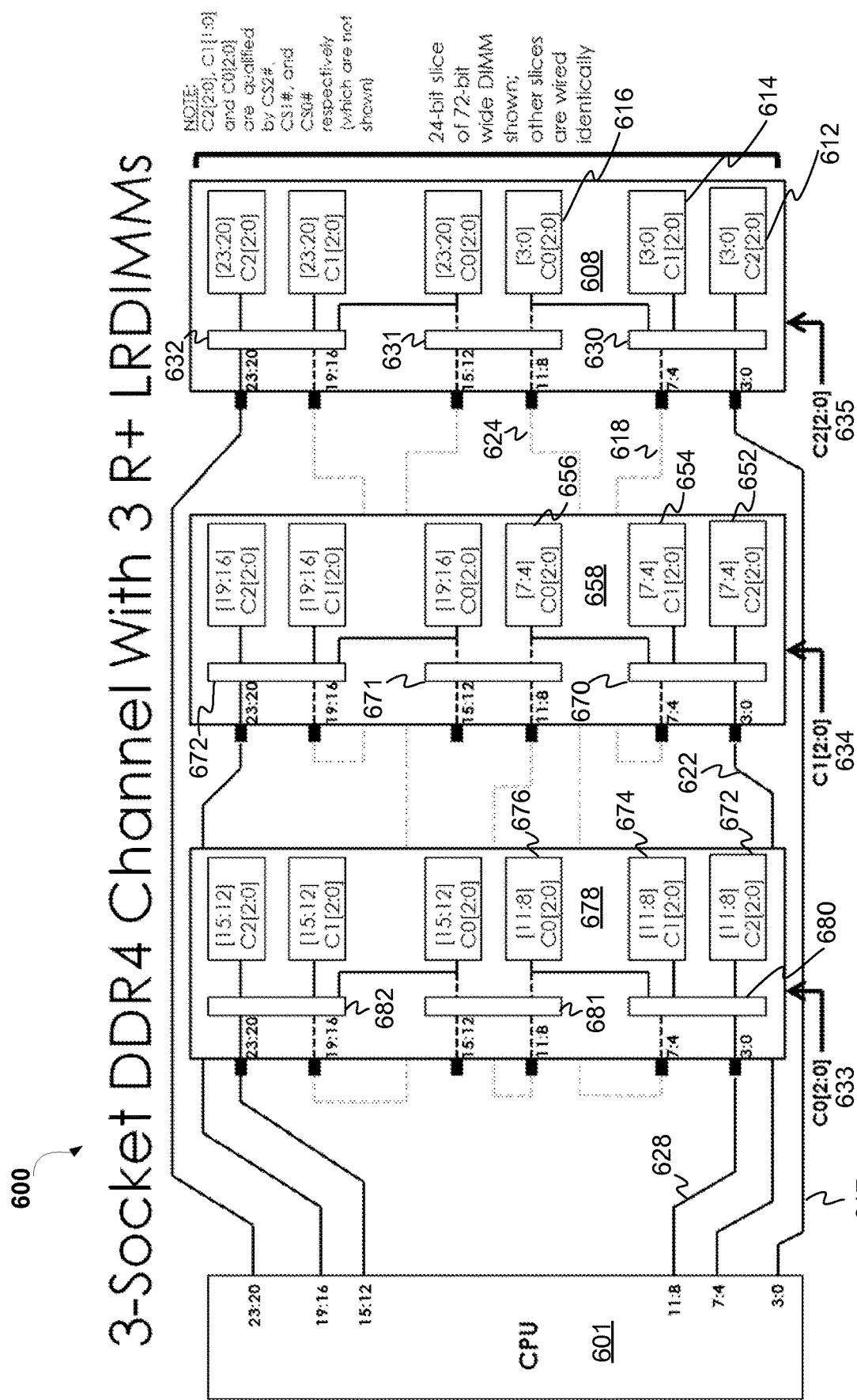
FIG. 6C is a diagram illustrating 3-SPC DDR4 channel with three DIMM slots populated with R+LRDIMMs according to one embodiment.

FIG. 6C is a diagram illustrating 3-SPC DDR4 channel 670 with three DIMM slots populated with R+LRDIMMs 608, 658, 678 according to one embodiment. The 3-SPC DDR4 channel 670 is similar to the 3-SPC DDR channel 650 as noted by similar reference labels. However, the first slot is populated with a third R+LRDIMM 678. The corresponding slice of the R+LRDIMM 678 includes six device sites, where each site may be a single memory component or multiple memory components. For ease of description, the data lines of three devices sites 612, 652, 672 in the 3-SPC DDR4 channel 670 are described. A first device site 612 is coupled to the CPU 401 via data lines 617 (first nibble) as described above with respect to 3-SPC DDR4 channel 600. A second device site 652 is coupled to the CPU 401 via data lines 622 (second nibble). A third device site 672 is coupled to the CPU 401 via data lines 628 (third nibble). It should be noted that the electrical connections for data lines 618, 624 and internal data lines to the DQ buffer components are present on the motherboard and R+LDIMMs, but are not used. Similar data lines can be used to connect the other device sites of the three R+LRDIMMs 608, 658, 678 to the CPU 601 for the other three nibbles in the slice. The DQ buffer components 630-632, DQ buffer components 670-672, and DQ buffer components 680-682 may be used for the device sites of the three R+LRDIMMs 608, 658, 678. In some cases, the DQ buffer components may act as repeaters or multiplexers as described herein. It should be noted that C2[2:0], C1[2:0] and C0[2:0] are qualified by CS2#, CS1#, and CS0#, respectively (not illustrated in FIG. 6C).

In some implementations, DDR4 R+ LRDIMM requires that all CS # and CKE signals in a memory channel be broadcast to all the DIMM slots (or DIMM sockets or module sockets) in the channel. With DPP, each data signal is connected to only one R+ LRDIMM. In a channel with multiple R+ LRDIMMs, each and every R+ LRDIMM respond s to a Read or Write operation. The DDR4 specification allows up to 8 ranks per DIMM slot. In one implementation, for single rank (SR) DIMM, rank 0 is controlled by CS0#, CKE0, and ODT0, for double-rank (DR) DIMM, rank 1 is controlled by CS1#, CKE1, and ODT1, and for quad-rank (QR) DIMM or octa-rank (OR) DIMM, rank is controlled by C[2:0], CS #, CKE, and ODT. The CS # signal may be a 1-cycle signal and is connected to only one DIMM slot, and broadcasting CS # to all DIMM slots may violate register setup and hold times. The embodiments described below create a private shared bus between the DIMM slots in a memory channel using pins defined as not connected (NC) or non-functional (NF) in the DDR4 RDIMM specification. ODT pins in each DIMM slot may optionally be used for the private bus since all DQ nets are always point-to-point. CA buffer components (also referred to as CA register) may be modified for operation with a local CS signal (local CS #) and clock enabled (CKE) signals and a distant CS signal (distant CS #) and CKE signals. Local CS signals are signals received directly from the memory controller (MC) and distant signals are signals from another DIMM connector on the private bus. The CA buffer component treats local CS signals different than distant CS signals. For example, in one embodiment, local signals go through two flip-flops before being driven to the DRAM devices, whereas distant signals go through 1 flip-flop before being driven to the DRAM devices.

Figure 7:
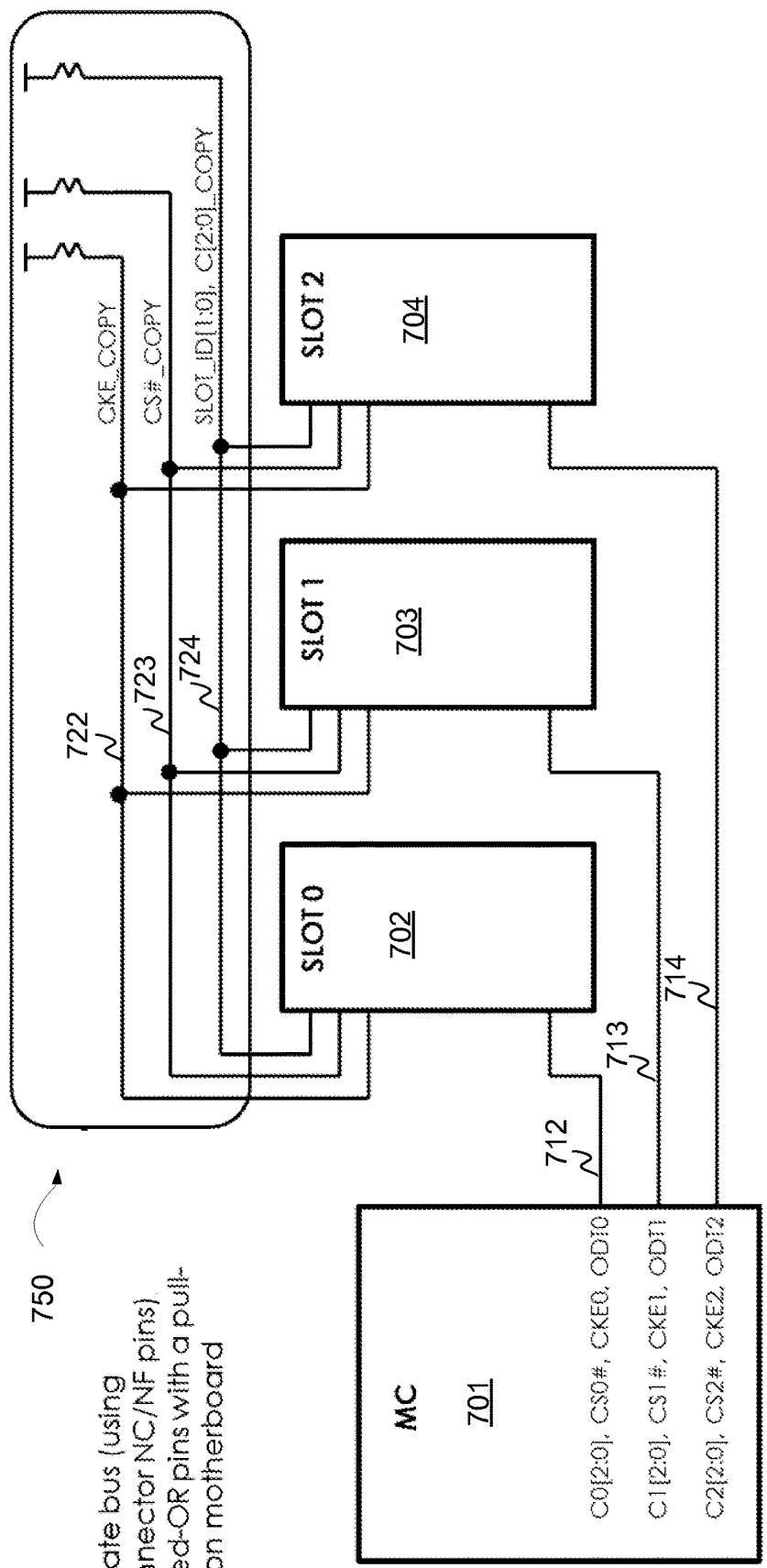
FIG. 7 is a diagram illustrating a private bus between three DIMM slots of a 3-SPC memory system according to one embodiment.

FIG. 7 is a diagram illustrating a private bus 750 between three DIMM slots 702-704 of a 3-SPC memory system 700 according to one embodiment. In the memory system 700, a memory controller (MC) 701 is coupled to three slots 702-704. A first set of control lines 712 is coupled between the MC 701 and a first slot 702 (slot 0) (e.g., CS0#[2:0], CKE0, and ODT0). A second set of control lines 713 is coupled between the MC 701 and a second slot 703 (slot1) (e.g., CS1#[2:0], CKE1, and ODT1). A third set of control lines 714 is coupled between the MC 701 and a third slot 704 (slot2) (e.g., CS2#[2:0], CKE2, and ODT2). For a SR DIMM configuration, rank 0 is controlled by CS0#, CKE0, and ODT0. For a DR DIMM configuration, rank 0 is controlled by CS0#, CKE0, and ODT0 and rank 1 is controlled by CS1#, CKE1, and ODT1. For a QR DIMM configuration or OR DIMM configuration, ranks are controlled by C[2:0], CS #, CKE, and ODT. C[2:0] may be 3 encoded CS signals with each one of CS0# or CS1#. C[2:0] may be used to control up to 8 ranks (e.g., stacked devices). For stacked technology devices, also referred to as 3DS technology, there may be 18 device sites and three C bits can be used to select devices at the selected device site. The CS # signal may be a 1-cycle signal and is connected to only one DIMM slot.

In one embodiment, the R+LRDIMMs at the three slots 702-704 receive three signals each and the R+LRDIMMs retransmit the signals to the other two slots on the private bus 750. The private bus 750 includes a first data line 722 for CKE_COPY, a second data line 723 for CS #_COPY, and a third set of data lines 724 for SLOT_ID[1:0] and C[2:0]_COPY. The SLOT_ID[1:0] can be used to identify which of the three slots 702-704 is retransmitting the CS information. C[2:0]_COPY is a copy of the CS[2:0] received by the respective slot. Similarly, CKE_COPY is a copy of the CKE received by the respective slot and CS #_COPY is a copy of the CS # received by the respective slot. The private bus 750 may use wired-OR pins with a pull-up on a motherboard upon which the three slots 702-704 are disposed.

In one embodiment, the following NC pins are available to use for the private bus 750: 92, 202, 224, 227, 232 and 234. In another embodiment, the following NF pins may be used: 88, 90, 200, 215, and 216. These NC and NF pins may be in the vicinity of the CA pins.

Figure 8:
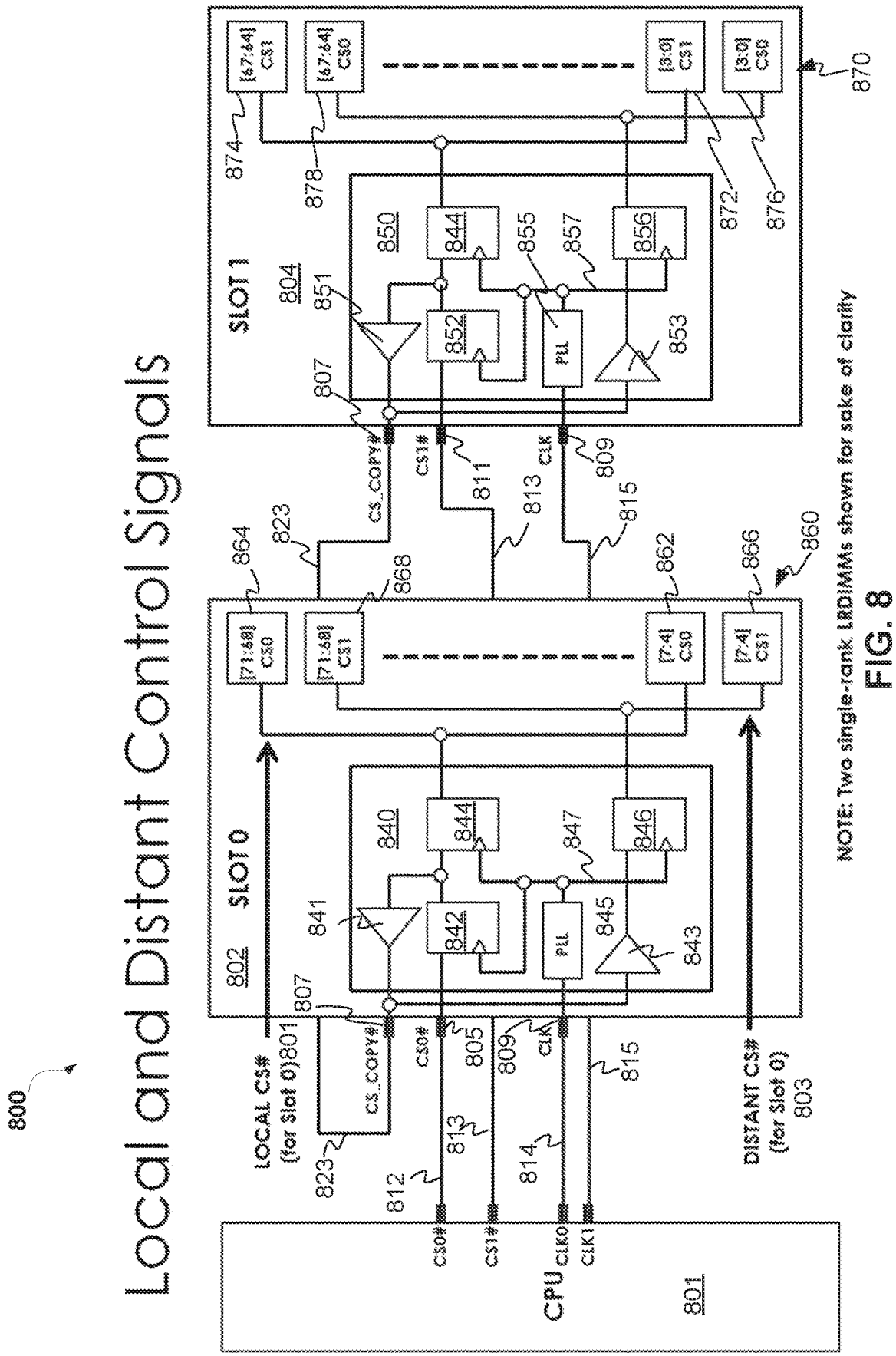
FIG. 8 is a diagram illustrating local control signals and distant control signals of a private bus between two DIMM slots of a memory system according to one embodiment.

FIG. 8 is a diagram illustrating local control signals 801 and distant control signals 803 of a private bus 823 between two DIMM slots 802, 804 of a memory system 800 according to one embodiment. A first DIMM slot 802 (slot 0) is populated with a first memory module with a CA buffer component 840 and a second DIMM slot 804 (slot 1) is populated with second memory module with a CA buffer component 850. The first memory module in the first DIMM slot 802 includes multiple device sites 860 and the second memory module in the second DIMM slot 804 includes multiple device sites 870. The device sites 860, 870 may each include a single memory component or each multiple memory components. These memory components may be DDR4 DRAM devices and the memory modules may be R+LRDIMMs. It should be noted that FIG. 8 illustrates two single-rank LRDIMMs for sake of clarity, but similar data lines can be connected to other devices sites 860 and 870.

The CA buffer component 840 includes a primary interface with a first pin 805, which is coupled to data line 812 to receive a local chip select (CS) signal (CS0#) 801, and a second pin 807, which is coupled to a data line of the private bus 823 to receive a distant CS signal (CS_COPY #) 803. The primary interface is coupled to the CPU 801. The CA buffer component 840 includes a secondary interface to select one or more of the device sites 860 (e.g., 862, 864, 866, 868). The CA buffer component 840 selects the device sites 862, 864 when the local CS signal 801 is received on the first pin 805 (for slot 0) and selects the device sites 866, 868 when the distant CS signal 803 is received on the second pin 807 (for slot 0). In other embodiments where there are additional slots, the CA buffer component 840 receives a second distant CS signal on a third pin (not illustrated) to select other device sites.

In a further embodiment, the CA buffer component 840 includes: 1) a first flip-flop 842 coupled to the first pin 805; 2) a second flip-flop 844 coupled to an output of the first flip-flop 842. An output of the second flip-flop 844 is coupled to the device sites 862, 864. The CA buffer component 840 also includes an input buffer 843 coupled to the second pin 807 and an output of the input buffer 843 is coupled to a third flip-flop 846. An output of the third flip-flop 846 is coupled to the device sites 866, 868. The first flip-flop 842, second flip-flop 844, and third flip-flop 846 are clocked by a timing signal 847. The timing signal 847 can be generated by a phase locked loop (PLL) 845, which is coupled to a fourth pin 809 that receive a clock signal (CLK0) on data line 814 from the CPU 801. The CA buffer component 840 also includes an output buffer 841 coupled to the output of the first flip-flop 842. An output of the output buffer 841 is coupled to the second pin 807. The output buffer 841 generates a second distant CS signal (e.g., CS_COPY #) on second pin 807. The output buffer 841 retransmits the local CS signal 801 received on the first pin 805 as the distant CS signal 803 on the second pin 807 to one or more other modules in other slots (e.g., second slot 804).

The CA buffer component 850 may also include similar primary and secondary interfaces as the CA buffer component 840. The primary interface couples to the CPU 801 and the secondary interface is to select one or more of the device sites 870 (e.g., 872, 874, 876, 878). The CA buffer component 850 selects the device sites 872, 874 when the local CS signal (CS1#) is received on a first pin 811 (for slot 1) from data line 813 coupled to the CPU 801. The CA buffer component 850 selects the device sites 876, 878 when the distant CS signal (CS_COPY #) is received on the second pin 807 (for slot 1) from the data line of the private bus 823 coupled to the first slot 802. The CA buffer component 850 includes: 1) a first flip-flop 852 coupled to the first pin 811; 2) a second flip-flop 854 coupled to an output of the first flip-flop 852. An output of the second flip-flop 854 is coupled to the device sites 872, 874. The CA buffer component 850 also includes an input buffer 853 coupled to the second pin 807 and an output of the input buffer 853 is coupled to a third flip-flop 856. An output of the third flip-flop 856 is coupled to the device sites 876, 878. The first flip-flop 852, second flip-flop 854, and third flip-flop 856 are clocked by a timing signal 857. The timing signal 857 can be generated by a PLL 855, which is coupled to a fourth pin 809 that receives a clock signal (CLK1) on data line 815 from the CPU 801. The CA buffer component 850 also includes an output buffer 851 coupled to the output of the first flip-flop 852. An output of the output buffer 851 is coupled to the second pin 807. The output buffer 851 generates a second distant CS signal (e.g., CS_COPY #) on second pin 807. The output buffer 841 retransmits the local CS signal received on the first pin 811 as the distant CS signal on the second pin 807 to one or more other modules in other slots (e.g., first slot 802).

Although FIG. 8 illustrates two DIMM slots 802, 804 and only four device sites per DIMM slot, in other embodiments, more than two DIMM slots can be used and more than four device sites per DIMM slot may be used. FIG. 8 also illustrates single-device memory sites, but in other embodiments, multi-device memory sites may be used, such as illustrated in FIG. 9.

Figure 9:
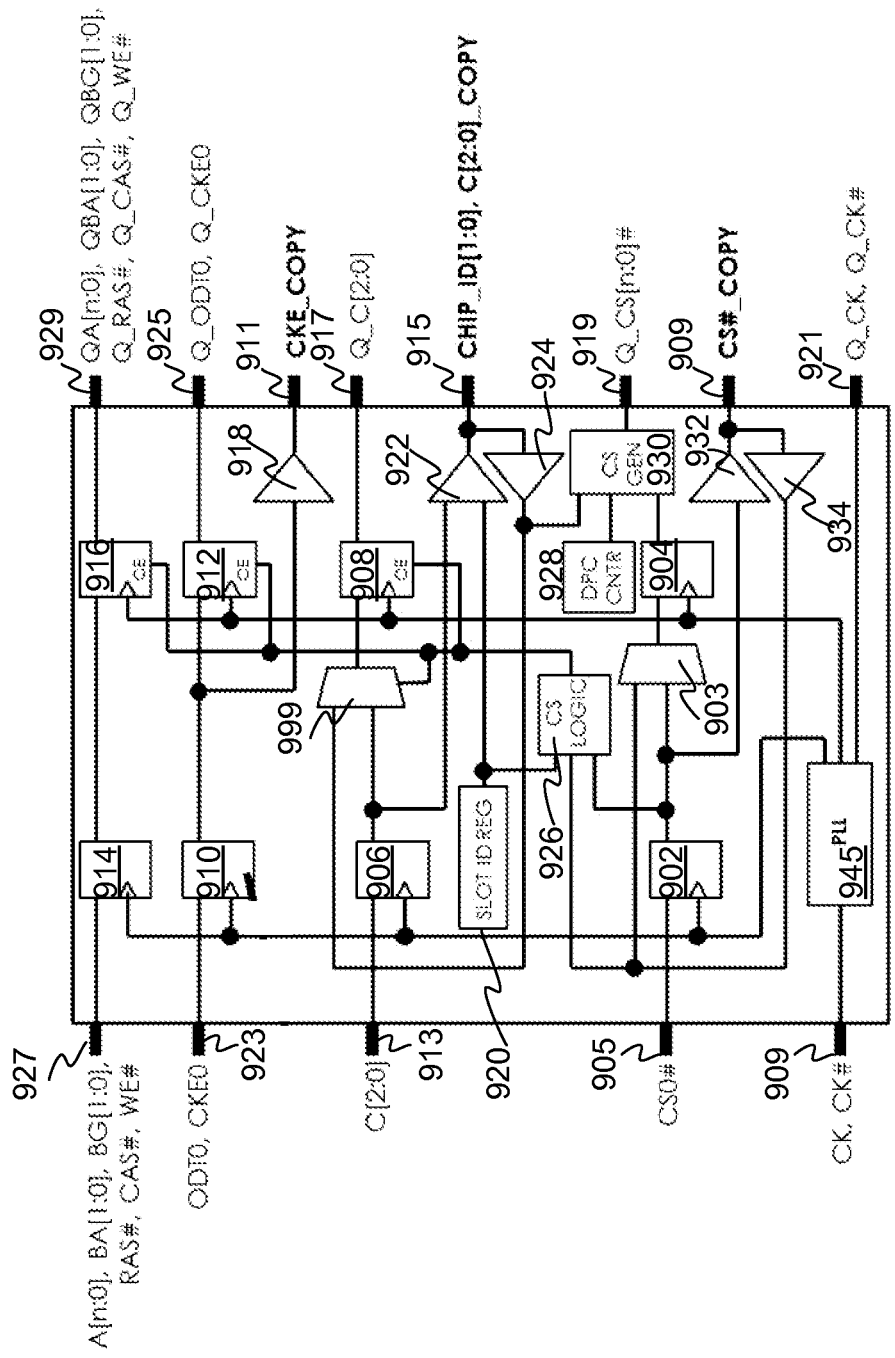
FIG. 9 is a diagram illustrating a command and address (CA) buffer component according to one embodiment.

FIG. 9 is a diagram illustrating a CA buffer component 900 according to one embodiment. The CA buffer component 900 includes a first flip-flop 902 that receives a local CS signal (CS0#) on a first pin 905. An output of the first flip-flop 902 is coupled to an output driver 932 to generate a distant CS signal (CS #_COPY) on a second pin 907. A distant CS signal can also be received on second pin 907 and an input buffer 934 directs the distant CS signal to a multiplexer 903, which also receives the output of the first flip-flop 902. An output of the multiplexer 903 is coupled to a second flip-flop 904. An output of the second flip-flop 904 is input into CS generation logic 930. The CS generation logic 930 also receives input from a DPC counter 928 and signals received on the pins 915 through an input buffer 924 (e.g., CHIP_ID[1:0], C[2:0]_COPY). The CS generation logic 930 generates CS signals on pins 919 (e.g., Q_CS[n:0]#). A PLL 945 receives a clock signal (CK, CK #) on pin 909 and generates a timing signal used to clock the first flip-flop 902 and the second flip-flop 904. The timing signal is also output on pin 921 (e.g., Q_CK, Q_CK #). CS logic 926 receives an output of the first flip-flop 902 and a SLOT ID from SLOT ID register 920. An output of the CS logic 926 enables fourth flip-flops 908 that output signals on pins 917 (e.g., Q C[2:0]), sixth flip-flops 912 that output signals on pins 925 (e.g., Q_ODT0, Q_CKE0), and eighth flip-flop 916 that output signals on pins 929 (e.g., QA[n:0], QBA[1:0], QBG[1:0], Q_RAS #, Q_CAS #, Q_WE #). The fourth flip-flop 908, sixth flip-flop 912 and eighth flip-flop 916 receives outputs from third flip-flop 906, fifth flip-flop 910, and seventh flip-flop 914. These flip-flops are also clocked by the timing signal generated by the PLL 945. The third flip-flop 906 receive signals C[2:0] on pins 913. The fifth flip-flops 910 receive signals a clock signal enable signal (CKE0) and ODT signal (ODT0) on pins 923. The seventh flip-flops 914 receive signals (e.g., A[n:0], BA[1:0], BG[1:0], RAS #, CAS #, WE #) on pins 927. An output of the third flip-flop 906 is coupled to a multiplexer 999, which also receives signals received on the pins 915 through the input buffer 924 (e.g., CHIP_ID[1:0], C[2:0]_COPY). An output of the multiplexer 999 is coupled to an input of the fourth flip-flop 908. An output of the fifth flip-flop 910 is coupled to an output buffer 918 to drive copies of the clock enable signal and ODT signal on pins 911 (e.g., CKE_COPY). An output of the third flip-flop 906 is coupled to an output buffer 922 to drive copes of the signals on pins 915 (e.g., CHIP_ID[1:0], C[2:0]_COPY).

In some implementations, some logic blocks can be bypassed when the CA buffer component 900 is operating as a standard DDR4 CA buffer component. The bypass path is not illustrated in FIG. 9. It should be noted that clock enable logic (CKE0 logic) is similar to the CS logic for CS0# logic, but is not shown for sake of clarity. In a further embodiment, the CA buffer component 900 sends configuration information and multiplexer control signals to DQ buffers on existing sideband signals as described herein.

Figure 10:
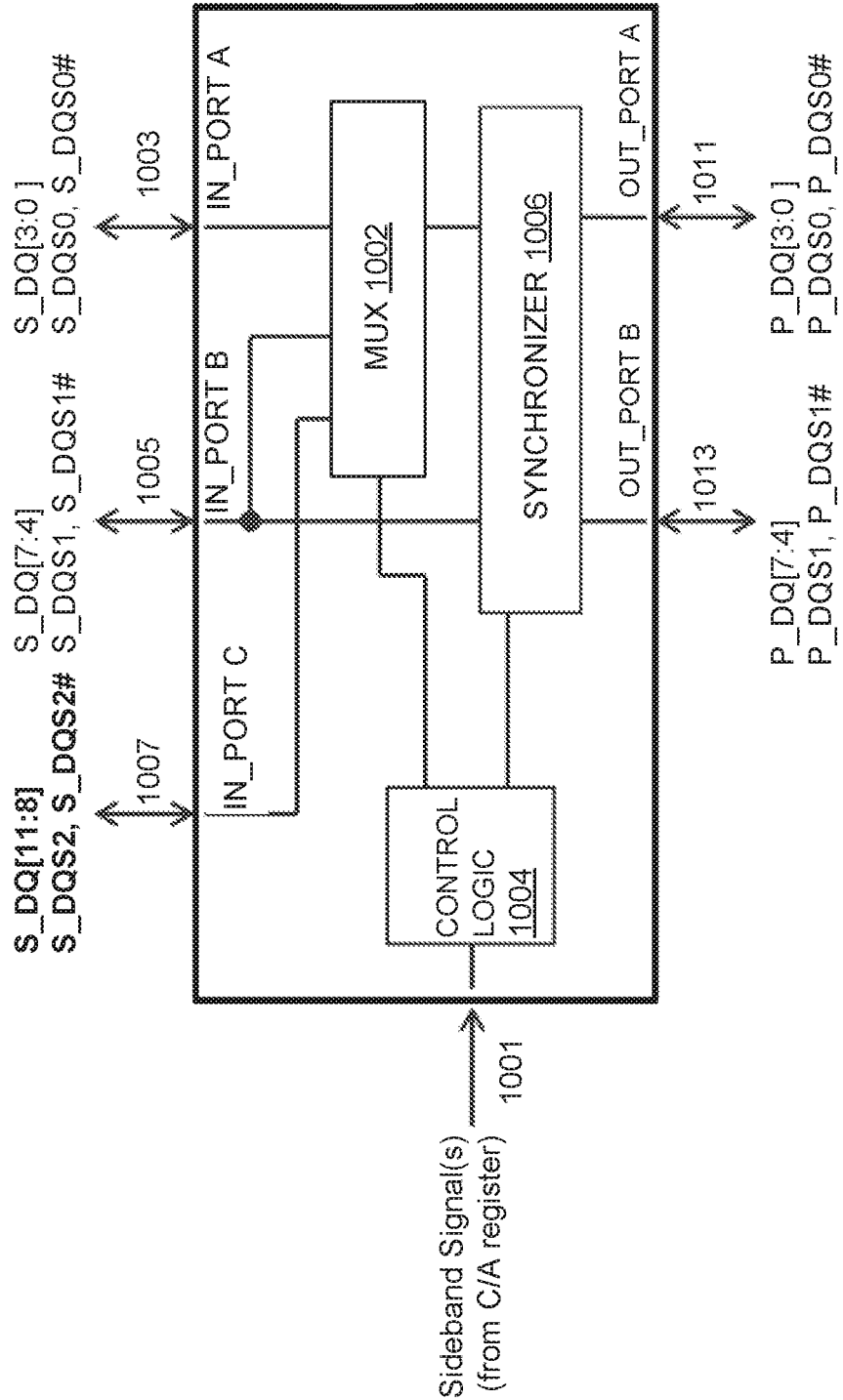
FIG. 10 is a diagram illustrating a data (DQ) buffer component according to one embodiment.

FIG. 10 is a diagram illustrating a data (DQ) buffer component 1000 according to one embodiment. The DQ buffer component 1000 includes a multiplexer 1002, control logic 1004 and a synchronizer 1006. The multiplexer 1002 is coupled to multiple input ports: IN_PORTA, IN_PORTB, and IN_PORTC. The multiplexer 1002 receives a first nibble, including data signals S_DQ[3:0] and timing signals S_DQS0 and S_DQS0#. It should be noted that nibble, as used herein, refers to the data signals and the corresponding timing signals, and thus, is 6-bits. The multiplexer 1002 receives a second nibble, including data signals S_DQ[7:4] and timing signals S_DQS1 and S_DQS1#. In a further embodiment, the multiplexer 1002 receives a third nibble, including S_DQ811:9] and timing signals S_DQS2 and S_DQS2#. The third port can be used for 3 SPC configurations, but these pins may not be needed for 2 SPC configurations. It should be noted that the multiplexer 1002 is a bi-directional multiplexer, such as a 3:1 mux and 1:3 demux.

As described above, sideband signals 1001 can be generated by the CA buffer component 900 of FIG. 9. Control logic 1004 receives the sideband signals 1001 to control the multiplexer 1002 and the synchronizer 1006. The synchronizer 1006 synchronizes the data to be output on first and second ports (OUT_PORTA, OUT_PORTB). For example, the synchronizer 1006 can output data signals (e.g., P_DQ[3:0]) and timing signals 1011 (e.g., P_DQS0 and P_DQS0#) on first port and can output data signals (e.g., P_DQ[7:4]) and timing signals 1013 (e.g., P_DQS1 and P_CDQ1#) on the second port.

Figure 11:
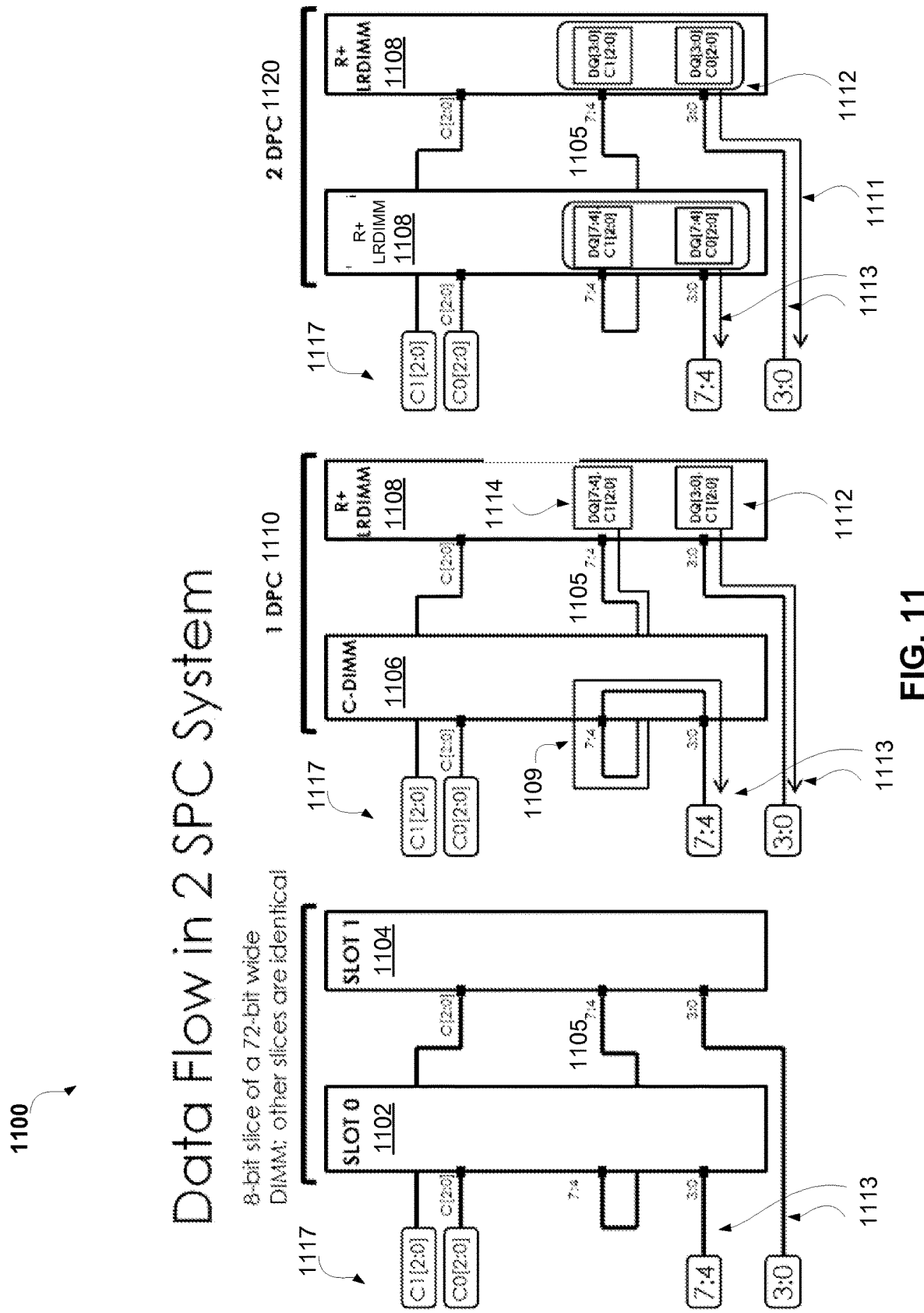
FIG. 11 is a diagram illustrating data flow in a 2-SPC system when populated with one R+LRDIMM in a 1 DPC configuration and when populated with two R+LRDIMMs in a 2 DPC configuration according to one embodiment.

FIG. 11 is a diagram illustrating data flow in a 2-SPC system 1100 when populated with one R+LRDIMM in a 1 DPC configuration 1110 and when populated with two R+LRDIMMs in a 2 DPC configuration 1120 according to one embodiment. The 2-SPC system 1100 includes a first slot 1102 (slot 0) and a second slot 1104 (slot 1). An 8-bit slice of a 72-bit wide DIMM is illustrated in FIG. 11, but the other slices are identical. A first set of data lines 1003 is disposed on a motherboard substrate and coupled to the first slot 1102 and second slot 1104 and a memory controller (not illustrated). The first set 1103 of data lines includes point-to-point data lines, each point-to-point data line of the first set 1103 is coupled to the memory controller and either one of the slots, but not both slots (also referred to herein as module sockets). The first set 1103 of data lines is greater than 64 data lines. The first set 1103 of data lines may be 72 bits to support ECC as described herein. A second set 1105 of data lines is disposed on the motherboard substrate and coupled between the first slot 1102 and second slot 1104. The CS signals 1117 are received at the first slot 1102 and second slot 1104.

In the 1 DPC configuration 1110, the first slot 1102 is populated with a C-DIMM 1106 and the second slot 1104 is populated with a R+LRDIMM 1108. Data flows to and from a first memory site 1112 of the R+LRDIMM 1108 along a first data path 1107 (first nibble) and data flows to and from a second memory site 1114 of the R+LRDIMM 1108 along a second path 1109 through the C-DIMM 1106 (second nibble). As described herein, the first and second nibbles may include 4-bits of data signals and two timing/clock signals.

In the 2 DPC configuration 1120, the first slot 1102 is populated with a first R+LRDIMM 1108 and the second slot 1104 is populated with a second R+LRDIMM 1108. Data flows to and from a first memory site 1112 of the second R+LRDIMM 1108 along a first data path 1111 (first nibble) and data flows to and from a first memory site 1122 of the first R+LRDIMM 1108 along a second path 1113. In this 2 DPC configuration, the second set of data lines 1105 are not used and are considered inactive. As described herein, the first and second nibbles may include 4-bits of data signals and two timing/clock signals.

Figure 12:
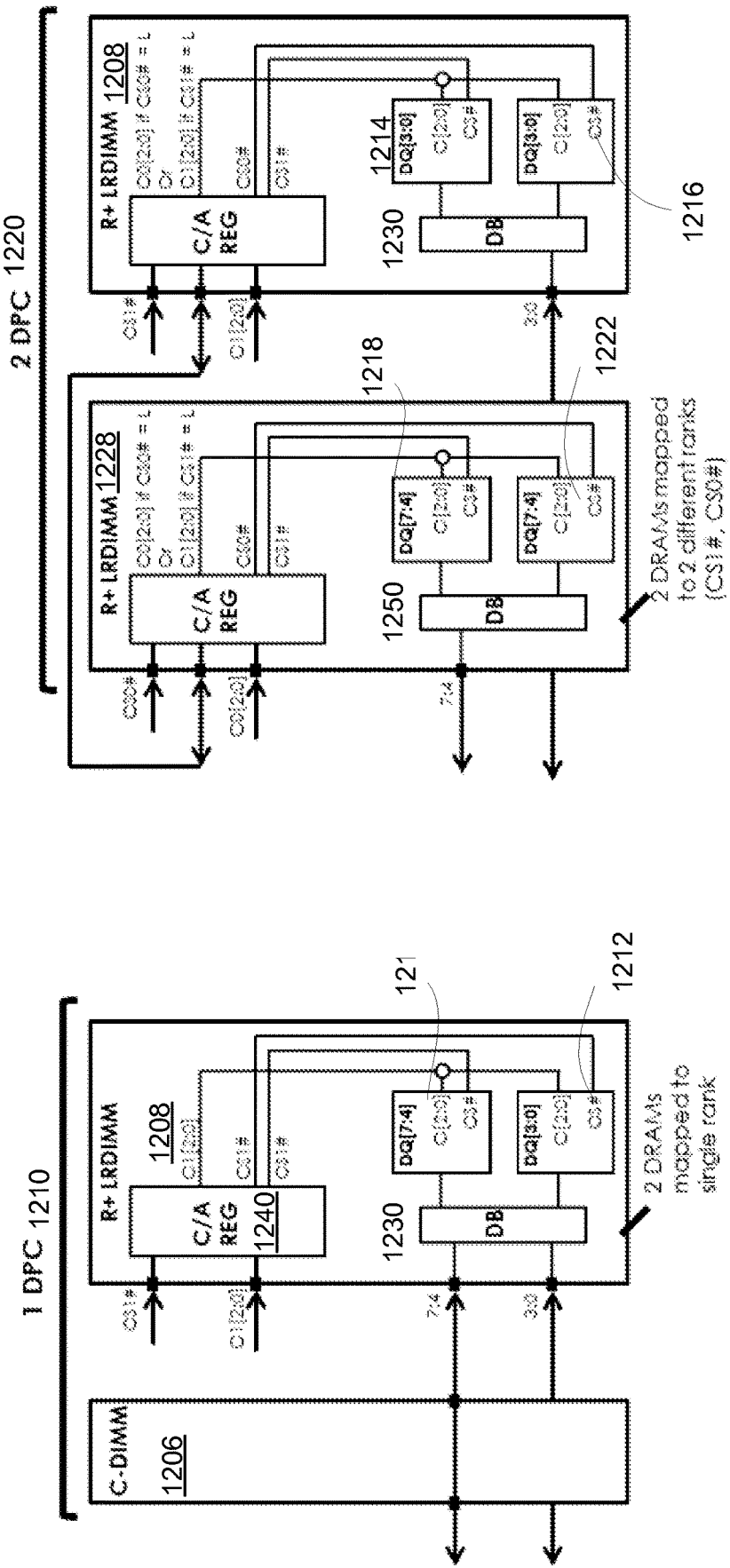
FIG. 12 is a diagram illustrating chip select (CS) generation in a 2-SPC system when populated with one R+LRDIMM and when populated with two R+LRDIMMs according to one embodiment.

FIG. 12 is a diagram illustrating chip select (CS) generation in a 2-SPC system 1200 when populated with one R+LRDIMM in a 1 DPC configuration 1210 and when populated with two R+LRDIMMs in a 2 DPC configuration 1220 according to one embodiment. In the 1 DPC configuration 1210, a first slot is populated with a C-DIMM 1206 and a second slot is populated with a R+LRDIMM 1208. The R+LRDIMM 1208 includes a DQ buffer component 1230 and CA buffer component 1240. The CA buffer component 1240 receives CS information on a primary interface and sends CS information on a secondary interface to select one of the device sites 1212, 1214. In this configuration, two DRAMS are mapped to a single rank. Alternatively, other configurations may be used.

In the 2 DPC configuration 1220, the first slot is populated with a second R+LRDIMM 1228 and the second slot is populated with a first R+LRDIMM 1208. The first R+LRDIMM 1208 includes the DQ buffer component 1230 and CA buffer component 1240. The second R+LRDIMM 1228 includes a DQ buffer component 1250 and CA buffer component 1260. The CA buffer components 1240, 1260 receive CS information on respective primary interfaces and send CS information on respective secondary interfaces to select the device sites 1212, 1214 and 1218, 1222, respectively. In this configuration, two DRAMS are mapped to two different ranks (CS #1, CS0#). Alternatively, other configurations may be used. It should also be noted that FIG. 12 illustrates one 8-bit slice of a 72-bit wide DIMM, but other slices are identical.

Figure 13:
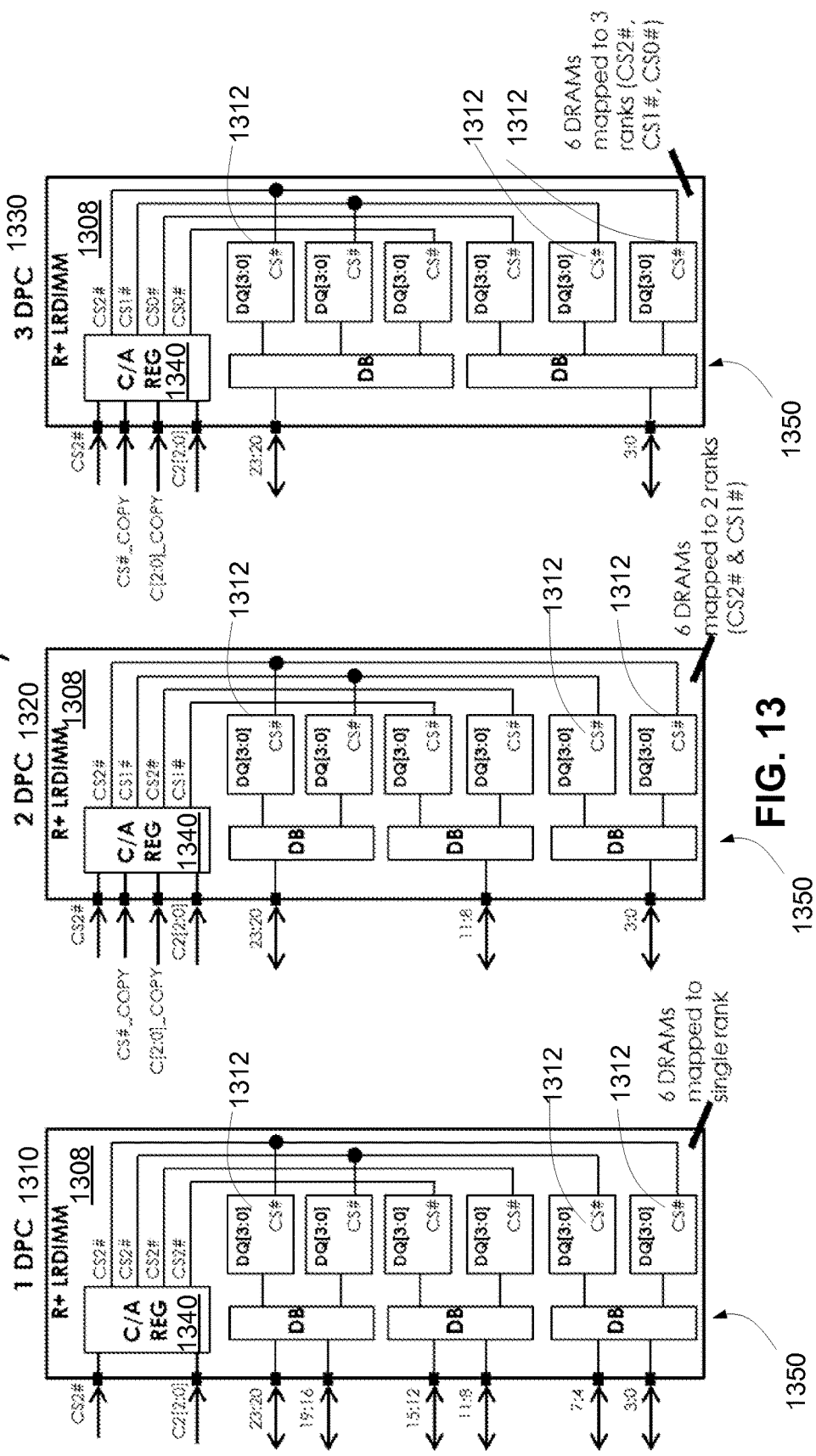
FIG. 13 is a diagram illustrating CS generation in a 3-SPC system when populated with one R+LRDIMM, when populated with two R+LRDIMMs, and when populated with three R+LRDIMMs according to one embodiment.

FIG. 13 is a diagram illustrating CS generation in a 3-SPC system when populated with one R+LRDIMM in a 1 DPC configuration 1310, when populated with two R+LRDIMMs in a 2 DPC configuration 1320, and when populated with three R+LRDIMMs in a 3 DPC configuration 1330 according to one embodiment. FIG. 13 illustrates only one R+LRDIMM 1308 in the 1 DPC, 2 DPC, and 3 DPC configurations 1310, 1320, 1330. The R+LRDIMM 1308 includes a CA buffer component 1340 and three DQ buffer components 1350 in the 1 DPC and 2 DPC configurations 1310, 1320. The R+LRDIMM 1308 includes a CA buffer component 1340 and two DQ buffer components 1350 in the 3 DPC configuration 1330. In 1 DPC configuration 1310 six DRAM devices are mapped to a single rank. In 2 DPC configuration 1320 six DRAM devices 1312 are mapped to two ranks (CS2# & CS1#). In 3 DPC configuration 1330 six DRAM devices are mapped to three ranks (CS2#, CS1#, and CS0#) rank. Alternatively, the device sites of the six DRAM devices 1312 can be device sites with multiple DRAM devices such as in stacked technologies.

The CA buffer component 1240 receives CS information on a primary interface and sends CS information on a secondary interface to select the appropriate DRAM device 1312. In this embodiment, all DRAM devices share common C[2:0] bus. In embodiments with multiple devices at a device site, additional CS information may be received on the primary interface to select the appropriate device at the selected device site. It should also be noted that FIG. 13 illustrates one 24-bit slice of a 72-bit wide DIMM, but other slices are identical.

Figure 14:
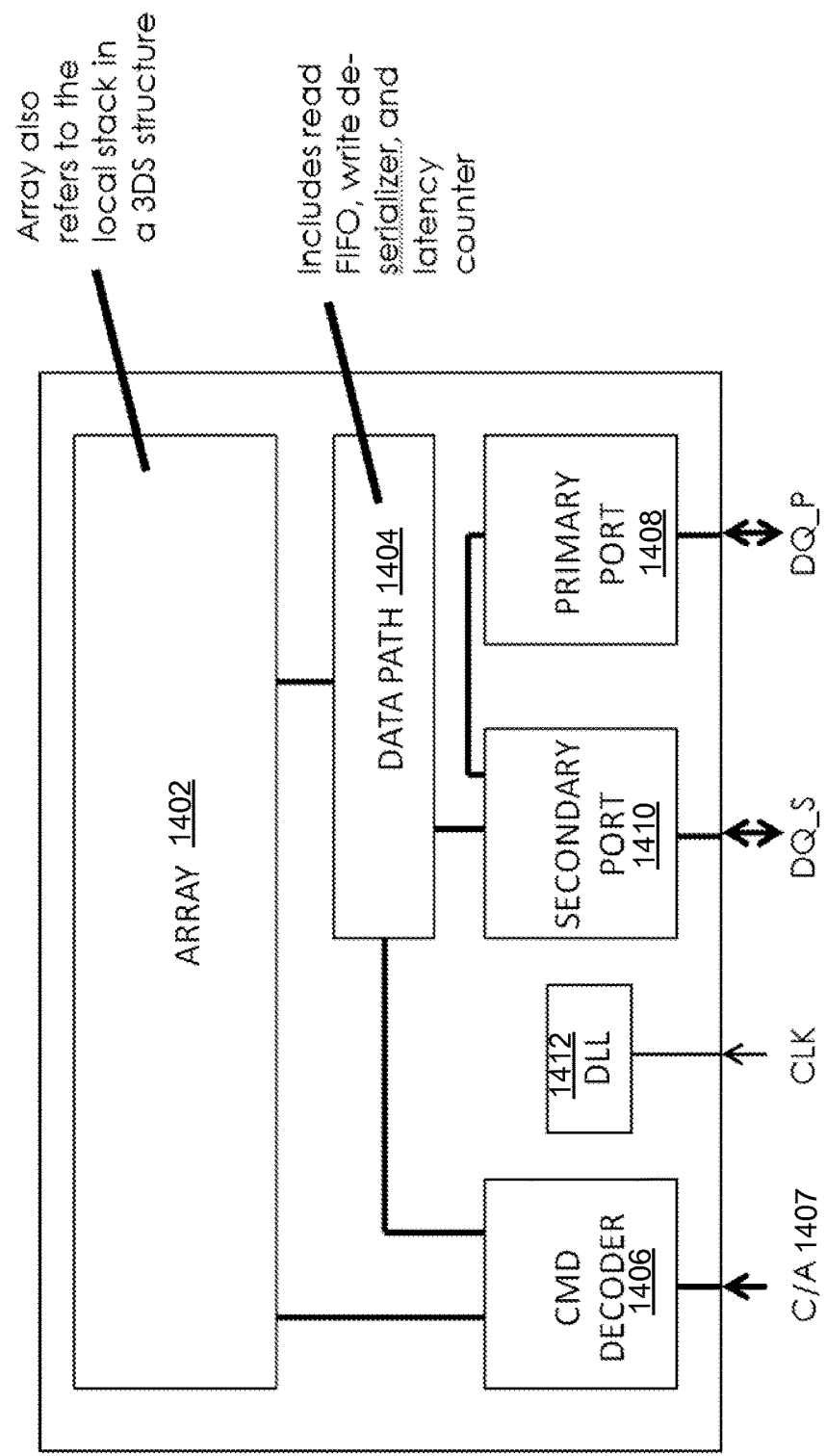
FIG. 14 is a diagram illustrating a R+DDR4 DRAM according to one embodiment.

FIG. 14 is a diagram illustrating a R+DDR4 DRAM 1400 according to one embodiment. The R+DDR4 DRAM 1400 includes an array 1402, a data path 1404 coupled to the array 1402, and a command decoder 1406 coupled to the array 1042 and the data path 1404. A primary port 1408 is coupled to a secondary port 1410, which is coupled to the data path 1404. The R+DDR4 DRAM 1400 also includes a delay locked loop (DLL) 1412. The array 1402 may also refer to a local stack at a device site, such as in a 3DS structure. The data path 1404 may include a read first-in-first-out (FIFO) buffer, a write deserializer, and a latency counter. The command decoder 1406 receives CA signals 1407 from a CA buffer component (not illustrated) to control the array 1402 and data path 1404. In some cases, data (DQ_P) is directed by the data path 1404 to or from the array 1402 through the primary port 1408 and secondary port 1410. In other cases, data (DQ_S) is directed by the data path 1404 to or from the array 1402 through the secondary port 1410. The primary port 1408 and secondary port 1410 are coupled to a DQ buffer component (not illustrated). In other scenarios, the primary port 1408 may be coupled to one DQ buffer component (not illustrated) and the secondary port 1410 may be coupled to another DQ buffer component (not illustrated).

In one embodiment, the R+ DDR4 DRAM is ×4 DDR4 DRAM or DDR4 3DS DRAM with dual ×4 ports. The primary port 1408 maps to the DQ[3:0] nibble in a ×4 DRAM and the secondary port 1410 maps to the unused DQ[7:4] nibble in a ×4 DRAM. The R+ DDR4 DRAM can be configured through a 2-bit configuration register, according to the following: 'b00: DRAM transmits and receives on the primary (DQ[3:0]) port; 'b01: DRAM transmits and receives on the secondary (DQ[7:4]) port; 'b10: DRAM MUX's primary port to either the internal core (or local 3DS stack) or the secondary port based on an external sideband signal; and 'b11: RFU (reserved for future use). As described herein, the DRAM configuration depends on a number of DIMM slots populated in a memory channel.

Figure 15A:
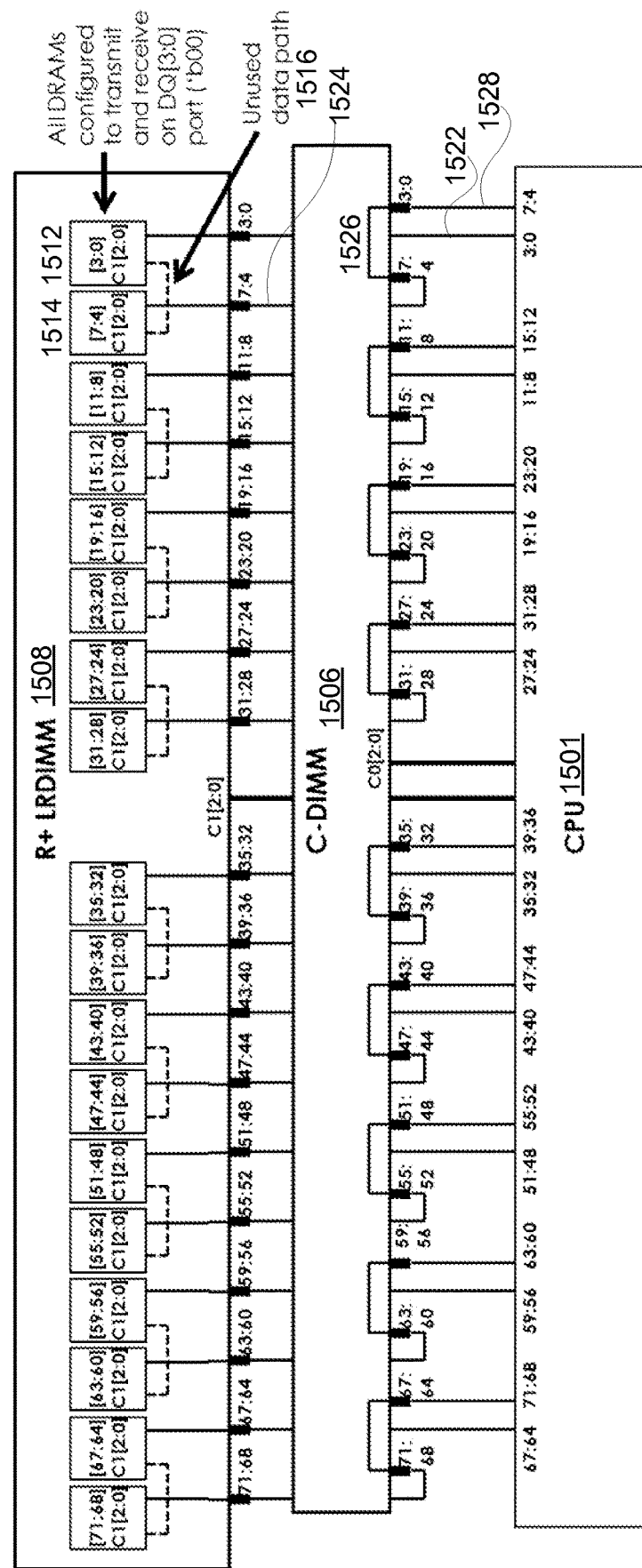
FIG. 15A is a diagram illustrating a 2-SPC DDR4 channel with one DIMM slot populated with one low-cost R+LRDIMM and another DIMM slot populated with a C-DIMM according to one embodiment.

FIG. 15A is a diagram illustrating a 2-SPC DDR4 channel 1500 with one DIMM slot populated with one low-cost R+LRDIMM 1508 and another DIMM slot populated with a C-DIMM 1506 according to one embodiment. The low-cost R+LRDIMM 1508 is considered low-cost in that it does not include the DQ buffer components present in the R+LRDIMMs described above. All DRAM devices (e.g., 1512, 1514) of low-cost R+LRDIMM 1508 are configured to transmit and receive on DQ[3:0] port ('b00). The low-cost R+LRDIMM 1508 includes 72 bits and eighteen device sites, each including a single DRAM device, such as illustrated with DRAM devices 1512, 1514. The DRAM device 1512 is coupled to a CPU 1501 via a first set of data lines 1522 (first nibble). The second DRAM device 1514 is coupled to the CPU 1501 via a second set of data lines 1524, and inner traces 1526 of C-DIMM 1506 connect data lines 1524 to data lines 1528, which are coupled to the CPU 1501 (second nibble). Although only two DRAM devices 1512, 1514 are described, similar sets of data lines can be used to connect the other sixteen DRAM devices to the CPU 1501 when the 2-SPC DDR4 channel 1500 is populated with one low-cost R+LRDIMM 1508. In this configuration, data lines 1516 between the first DRAM device 1512 and second DRAM device 1514 are unused (inactive). In one implementation, JEDEC standard DDR4 LRDIMM has ten buffer components (10 chips) to address SI limitations of multi-drop topology, including one CA buffer components (also referred to as C/A register (RCD)) and nine DQ buffered components (also referred to as DBs). This 10-chip solution has significant cost premium over RDIMM. The low-cost DDR4 R+LRDIMM 1508 uses DPP technology to ensure that all DQ signals are always point-to-point and there are no multi-drop DQ nets. Since all DQ signals are point-to-point, RCD and DBs can be combined into a single integrated circuit (IC) (or "single chip"). The single chip solution provides cost savings and power savings over a 10-chip solution, reducing cost premium of LRDIMM over RDIMM. The low-cost DDR4 R+LRDIMM 1508 can be buffer-less in that the low-cost DDR4 R+LRDIMM 1508 can implement the buffer function in an R+DDR DRAM device. This cost reduction may fit well with 3DS structures that are supported in the DDR4 specification. 3DS master-slave architecture presents a single electrical load on the channel irrespective of a number of ranks in the DIMM. The changes to the CA buffer component, as described herein, to support R+LRDIMM may also enable low-cost R+LRDIMM. That is, the same CA buffer component can be used for R+LRDIMM and low-cost R+LRDIMM. For example, the steering logic on a master device can be presented and not enabled.

Figure 15B:
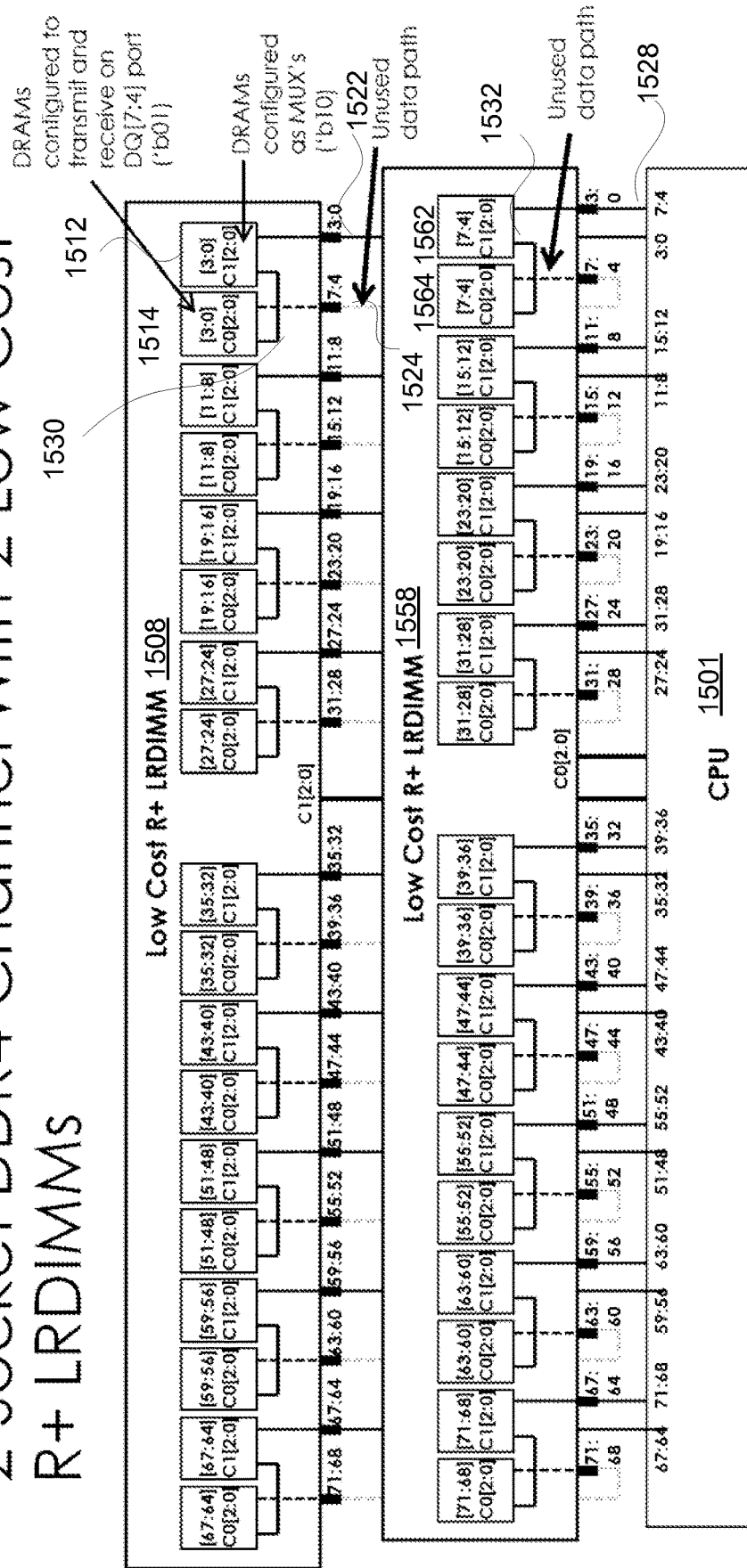
FIG. 15B is a diagram illustrating 2-SPC DDR4 channel with two DIMM slots populated with low-cost R+LRDIMMs according to one embodiment.

FIG. 15B is a diagram illustrating 2-SPC DDR4 channel 1550 with two DIMM slots populated with low-cost R+LRDIMMs 1508, 1558 according to one embodiment. The low-cost R+LRDIMMs 1508, 1558 are considered low-cost in that they do not include the DQ buffer components present in the R+LRDIMMs described above. Some of DRAM devices (e.g., 1514, 1564) of low-cost R+LRDIMMs 1508, 1558 are configured to transmit and receive on DQ[7:4] port ('b01) and others DRAM devices (e.g., 1512, 1562) are configured as multiplexers (port 'b10) and transmit and receive on DQ[3:0] port. The low-cost R+LRDIMM 1508 includes 72 bits and eighteen device sites, each including a single DRAM device, such as illustrated with DRAM devices 1512, 1514. The low-cost R+LRDIMM 1558 also includes 72 bits and eighteen device sites, each including a single DRAM device, such as illustrated with DRAM devices 1562, 1564 and. The DRAM device 1512 is coupled to a CPU 1501 via the first set of data lines 1522 (first nibble). The DRAM device 1562 is coupled to the CPU 1501 via data lines 1528. The second DRAM device 1514 is coupled to the first DRAM device 1512 via data lines 1530. The second DRAM device 1564 is coupled to the first DRAM device 1562 via data lines 1532. Although only two DRAM devices (1512, 1514 or 1562, 1564) are described, similar sets of data lines can be used to connect the other sixteen DRAM devices to the CPU 1501 when the 2-SPC DDR4 channel 1550 is populated with two low-cost R+LRDIMMs 1508, 1558. In this configuration, data lines 1524 between the first and second slots are unused (inactive).

In the 2-SPC DDR4 channel 1550, the data lines 1522 and 1528 are considered a primary channel and the data lines 1530 and 1532 are considered a secondary channel. Simulations have shown that the primary channel and the secondary channel can both operate at 3.2 Gb/s. In some embodiments, the private bus, as described above, can operate at 1.6 Gb/s, the CA bus can operate at 1.6 Gb/s, and the DQ bus can operate at 3.2 Gb/s for a DDR4 3 SPC memory system. In further embodiments, the R+LRDIMM architecture can scale to rates beyond DDR4 data rates. For example, In one embodiment, the private bus can operate at 1.6 Gb/s, the CA bus can operate at 1.6 Gb/s, and the DQ bus can operate at 6.4 Gb/s for a beyond-DDR4 3 SPC memory system. These data rates can be achieved in 72-bit wide DIMMs as described herein. Alternatively, other width DIMMs can utilize the technologies descried herein.

The beyond-DDR4 DRAM devices can be used in various memory systems, as illustrated in FIGS. 16A-16E. The beyond-DDR4 DRAM devices can be used for tablets, PCs, and servers. The data rates for the DQ buses may be in a range between 3.2 Gb/s to 6.4 Gb/s data rates with low voltage swing terminated logic (LVSTL), single-ended signaling. Multi-rank and multi-DIMM cycle redundancy check (CRC) may ensure integrity of data transmission. The beyond-DDR4 DRAM devices can have higher power efficiency than DDR4 DRAM devices, such as greater than 25%. For example, there may be zero DRAM input-output (I/O) power dissipation at all times except during CAS operation. In addition, an asymmetric design of the beyond-DDR4 DRAM device may ensure lower DRAM cost and higher DRAM yield. DLL and other complex timing circuits may be moved to the memory controller. As illustrated and described below with respect to FIGS. 16A=16E. For example, unregister DIMM (UDIMM), registered DIMM (RDIMM), LRDIMM, and motherboard configurations can be used to achieve full capacity expansion, 2 DPC or 3 DPC) at a maximum data rate (e.g., 3.2 Gb/s or 6.4 Gb/s). The beyond-DDR4 DRAM device also reuses existing infrastructure of the DDR4 DRAM device. This may allow the use of standard connectors, memory modules, IC packages, PCBs, or the like.

As described herein, the DPP may permit the memory bus to operate at data rates beyond DDR4 data rates. to operate memory bus at beyond DDR4 data rates. Even with LRDIMM, multi-drop topology limits bus speed to less than 3 Gb/s for 2 DPC. The proposed DPP implementations fit well within the "beyond-DDR4" DRAM devices being developed. The CA bus may operate at 1.6 Gb/s and the private bus can be implemented with 1-clock added latency if no CPU support. The beyond-DDR4 data rates depend on memory channel configuration. For example, 4.8 Gb/s data rates can be demonstrated under WC conditions with 1

CDIMM (i.e. partially loaded channel) and 6.4 Gb/s data rates can be demonstrated under WC conditions with no CDIMMs (i.e. fully loaded channel)

Figures 16A, 16B:
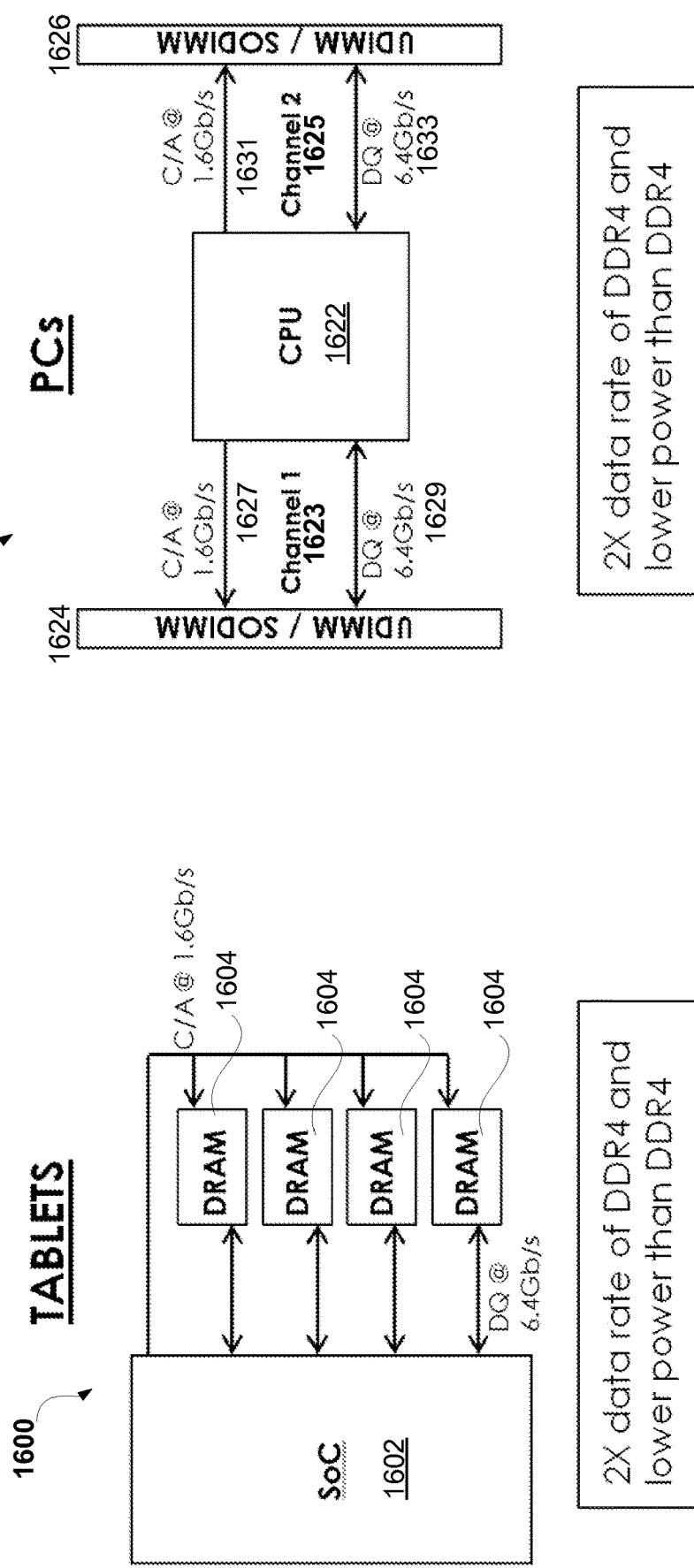
FIG. 16A is a diagram illustrating a tablet memory configuration with a system on chip (SoC) and four beyond-DDR4 DRAM devices according to one embodiment.
FIG. 16B is a diagram illustrating a personal computer (PC) memory configuration with a CPU and two memory channels to two DIMM slots, populated with beyond-DDR4 DRAM devices according to one embodiment.

FIG. 16A is a diagram illustrating a tablet memory configuration 1600 with a system on chip (SoC) 1602 and four beyond-DDR4 DRAM devices 1604 according to one embodiment. A CA bus 1603 can operate at 1.6 Gb/s to control the four beyond-DDR4 DRAM devices 1604 and a DQ bus 1605 between the SoC 1602 and the four beyond-DDR4 DRAM devices 1604 can operate at 6.4 Gb/s. This is 2× data rate of DDR4 devices and lower power than DDR4 devices. The tablet memory configuration 1600 may be used in a tablet device. Alternatively, the tablet memory configuration 1600 can be used in other portable electronic devices.

FIG. 16B is a diagram illustrating a personal computer (PC) memory configuration 1620 with a CPU 1622 and two memory channels 1623, 1625 to two DIMM slots 1624, 1626, populated with beyond-DDR4 DRAM devices according to one embodiment. A first memory channel 1623 is coupled between the first DIMM slot 1624 (e.g., UDIMM/SODIMM) and includes a CA bus 1627 that operates at 1.6 Gb/s and DQ bus 1629 that operates at 6.4 Gb/x. A second memory channel 1625 is coupled between the second DIMM slot 1626 (e.g., UDIMM/SODIMM) and includes a CA bus 1631 that operates at 1.6 Gb/s and DQ bus 1633 that operates at 6.4 Gb/x. This is 2× data rate of DDR4 devices and lower power than DDR4 devices. The PC memory configuration 1620 may be used in a PC. Alternatively, the PC memory configuration 1620 can be used in other electronic devices with a CPU and one or more DIMMs.

FIG. 16C is a diagram illustrating a first server memory configuration 1640 with a CPU 16 42 and a 1-SPC memory channel 1643 with one DIMM slot 1644 (e.g., ECC UDIMM) populated with one or more beyond-DDR4 R+LRDIMMs according to one embodiment. The memory channel 1643 is coupled between the DIMM slot 1644 (e.g., ECC UDIMM) and includes a CA bus 1645 that operates at 1.6 Gb/s and DQ bus 1647 that operates at 6.4 Gb/s. This is 2× data rate of DDR4 devices and lower power than DDR4 devices.

FIG. 16D is a diagram illustrating a second server memory configuration 1660 with a CPU 1662 and a 2-SPC memory channel 1663 with two DIMM slots 1664, 1666, populated with one or two R+LRDIMMs with beyond-DDR4 DRAM devices according to one embodiment. The memory channel 1663 is coupled between a first DIMM slot 1664 (e.g., LRDIMM) and a second DIMM slot 1666 (e.g., RDIMM/LRDIMM). The memory channel 1663 includes a CA bus 1665 that operates at 1.6 Gb/s. The CA bus 1665 may be a multi-drop bus. The memory channel 1663 also includes a first portion 1667 of a DQ bus between the CPU 1662 and the first slot 1664 that operates at 6.4 Gb/s and a second portion 1669 of the DQ bus between the CPU 1662 and the second slot 1666 that operates at 4.8 Gb/s. Ranks 2-8 may operate at 1.5× data rate of DDR4 and 16 ranks may operate at 2× data rate of DDR4.

FIG. 16E is a diagram illustrating a third server memory configuration 1680 with a CPU and a 3-SPC memory channel 1683 with three DIMM slots populated with one, two or three R+LRDIMMs with beyond-DDR4 DRAM devices according to one embodiment. The memory channel 1683 is coupled between a first DIMM slot 1684 (e.g., LRDIMM), a second DIMM slot 1686 (e.g., LRDIMM), and a third DIMM slot 1688 (e.g., RDIMM/LRDIMM). The memory channel 1683 includes a CA bus 1685 that operates at 1.6 Gb/s. The CA bus 1685 may be a multi-drop bus. The memory channel 1683 also includes a DQ bus that operates at 6.4 Gb/s. The DQ bus may include a first portion 1687 between the CPU 1682 and the first DIMM slot 1684, a second portion 1689 between the CPU 1682 and the second DIMM slot 1686, and a third portion 1691 between the CPU 1682 and the third DIMM slot 1688. Ranks 2-16 may operate at 1.5× data rate of DDR4 and 24 ranks may operate at 2× data rate of DDR4. Alternatively, other server memory configurations are possible using the R+LRDIMMs and low-cost R+LRDIMMs described herein.

The embodiments described herein may also be compatible with standard error detection and correction (EDC) codes. This includes standard (Hamming) ECC bit codes and standard "Chip-kill" symbol codes. In fact, in some configurations, the embodiments can correct for the complete failure of a module. In some embodiments, the device sites include at least one of a single memory die, a package stack of at least two memory dies, or a die stack of at least two memory dies. In other embodiments, a memory system includes a memory controller, a motherboard substrate with at least three module sockets (or slots). At least one of the at least three memory modules socket is populated with a memory module including multiple memory components and a command and address (CA) buffer component. The memory system further includes a first set of data lines coupled between the memory controller and the at least three module sockets; and a second set of data lines coupled between the two module sockets. The module sockets may be dual in-line memory modules (DIMM) sockets.

In another embodiment, a memory module includes multiple module connector pins; multiple device sites; and a CA buffer component. The CA buffer component is configured to: receive chip select information on a primary set of CS lines coupled between the module connector pins and the CA buffer component; and send the CS information on a private bus to other modules in other module sockets as described herein. The CS information selects one of multiple ranks.

In other embodiments, the memory module further includes a second set of multiple module connector pins; a DQ buffer component; a third set of data lines coupled between the second multiple module connector pins and the DQ buffer component; and a fourth set of data lines coupled between the DQ buffer component and the multiple device sites. The memory module may include a second DQ buffer component and a third DQ buffer component. Each of the multiple ranks includes at least three device sites. These device sites may contain at least one of a single memory device, a package stack of at least two memory devices, or a die stack of at least two memory devices.

In other embodiments, a memory module includes multiple module connector pins; multiple device sites; and a CA buffer component. The CA buffer component includes a primary CA interface connected to a memory channel and a secondary CA interface connected to the multiple device sites. The CA buffer component is further configured to receive a first set of one-hot chip select control signals on the primary CA interface, and pass the one-hot chip select signals to the private bus to the other module sockets. The CA buffer components selects one memory device at each of the multiple device sites to perform a first command specified on other lines of the CA interface.

In another embodiment, the memory module further includes multiple data-link buffer devices. The memory module is configured to operate in a first mode of operation or a second mode of operation. In the first mode of operation, the memory module is inserted onto a first type of memory channel with multi-drop data links shared with at least one other memory module. In the second mode of operation, the memory module is inserted onto a second type of memory channel with point-to-point data links that do not share with the at least one other memory module as described herein.

In another embodiment, a motherboard substrate includes at least three module sockets (or slots). At least one of the at least three memory modules socket is populated with a memory module. The memory module includes multiple device sites coupled to a DQ buffer component via data lines and coupled to a CA buffer component via CS lines. There are two classes of links: the CA (control-address) links and the DQ (data) links. These signals are transmitted (and received, in the case of DQ links) by a memory controller component (also referred to herein as a memory controller but can be other components that control access to the memory modules). These signals are typically received (and transmitted, in the case of DQ links) by buffer components on a module, such as a CA buffer component and one or more DQ buffer components. Various embodiments discussed in present application are directed to memory modules with seventy-two data links (72 DQ links) to accommodate standard ECC codes. The technologies described in the present embodiments can be applied to memory modules with other number of data links as well, such as sixty-four DQ links.

The embodiments disclosed in this disclosure can be employed to gain a number of important benefits. For example, the signaling integrity of the DQ links may be improved significantly from the multi-drop topology of standard systems: each DQ link uses a point-to-point topology. High capacity systems described herein may allow standard error detection and correction codes (i.e. ECC, Chip-kill); in addition, in some configurations it is possible to correct for the complete failure of a module. These improvements may be achieved while maintaining a high degree of compatibility to standard memory systems and their components. For example, there may be no changes to the memory components, modest changes or no changes to the memory controller component. There may be changes to the module and the motherboard wiring as described herein. However, the modules described herein may be compatible with standard systems, as well as high-capacity systems. By offering a standard mode and an improved mode of operation, the manufacturer of the controller component and the buffer component can deliver the same product into both standard motherboards and improved, high capacity motherboards, for example.

Figure 17:
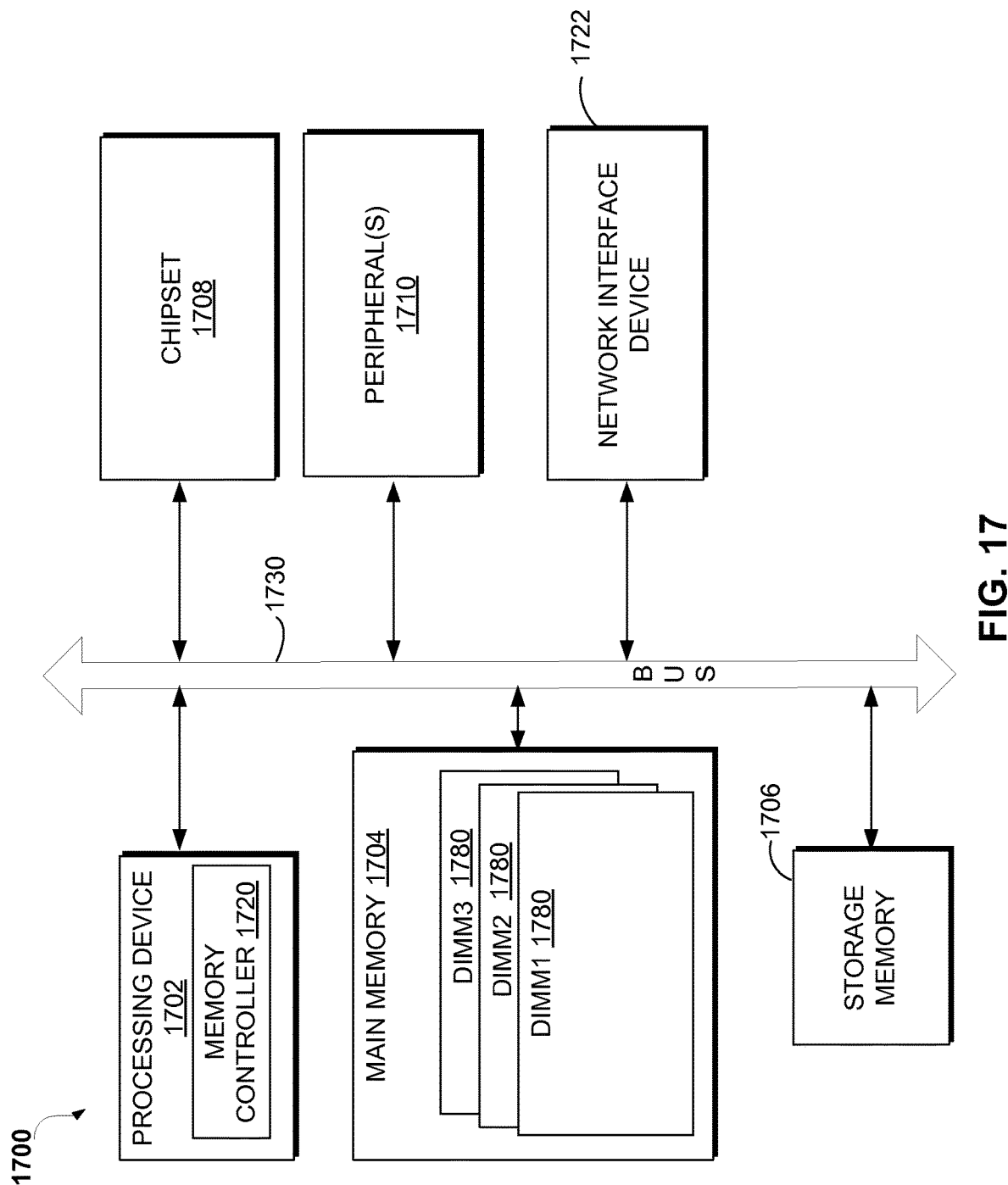
FIG. 17 is a diagram of one embodiment of a computer system, including main memory with three memory modules according to one embodiment.

FIG. 17 is a diagram of one embodiment of a computer system 1700, including main memory 1704 with three memory modules 1780 according to one embodiment. The computer system 1700 may be connected (e.g., networked) to other machines in a LAN, an intranet, an extranet, or the Internet. The computer system 1700 can be a host in a cloud, a cloud provider system, a cloud controller, a server, a client, or any other machine. The computer system 1700 can operate in the capacity of a server or a client machine in a client-server network environment, or as a peer machine in a peer-to-peer (or distributed) network environment. The machine may be a personal computer (PC), a tablet PC, a console device or set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The computer system 1700 includes a processing device 1702 (e.g., host processor or processing device), a main memory 1704 (e.g., read-only memory (ROM), flash memory, dynamic random access memory (DRAM), a storage memory 1706 (e.g., flash memory, static random access memory (SRAM), etc.), and a secondary memory 1718 (e.g., a data storage device in the form of a drive unit, which may include fixed or removable computer-readable storage medium), which communicate with each other via a bus 1730. The main memory 1704 includes one, two or three memory modules 1780 (e.g., R+LRDIMMS) that are described in various embodiments herein.

Processing device 1702 represents one or more general-purpose processing devices such as a microprocessor, central processing unit, or the like. More particularly, the processing device 1702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1702 may also be one or more special-purpose processing devices such as an application specific integrated circuit (ASIC), a field programmable gate array (FPGA), a digital signal processor (DSP), network processor, or the like. Processing device 1702 includes a memory controller 1720 as described above. The memory controller 1754 is a digital circuit that manages the flow of data going to and from the main memory 1704. The memory controller 1720 can be a separate integrated circuit, but can also be implemented on the die of a microprocessor. The memory controller 1720 may the memory controller described in various embodiments described herein.

In one embodiment, the processing device 1702 may reside on a first integrated circuit and the main memory 1704 may reside on a second integrated circuit. For example, the integrated circuit may include a host computer (e.g., CPU having one more processing cores, L1 caches, L2 caches, or the like), a host controller or other types of processing devices 1702. The second integrated circuit may include a memory device coupled to the host device, and whose primary functionality is dependent upon the host device, and can therefore be considered as expanding the host device's capabilities, while not forming part of the host device's core architecture. The memory device may be capable of communicating with the host device via a DQ bus and a CA bus. For example, the memory device may be a single chip or a multi-chip module including any combination of single chip devices on a common integrated circuit substrate. The components of FIG. 17 can reside on "a common carrier substrate," such as, for example, an integrated circuit ("IC") die substrate, a multi-chip module substrate or the like. Alternatively, the memory device may reside on one or more printed circuit boards, such as, for example, a mother board, a daughter board or other type of circuit card. In other implementations, the main memory and processing device 1702 can reside on the same or different carrier substrates.

The computer system 1700 may include a chipset 1708, which refers to a group of integrated circuits, or chips, that are designed to work with the processing device 1702 and controls communications between the processing device 1702 and external devices. For example, the chipset 1708 may be a set of chips on a motherboard that links the processing device 1702 to very high-speed devices, such as main memory 1704 and graphic controllers, as well as linking the processing device to lower-speed peripheral buses of peripherals 1710, such as USB, PCI or ISA buses.

The computer system 1700 may further include a network interface device 1722. The computer system 1700 also may include a video display unit (e.g., a liquid crystal display (LCD)) connected to the computer system through a graphics port and graphics chipset, an alphanumeric input device (e.g., a keyboard), a cursor control device (e.g., a mouse), and a signal generation device (e.g., a speaker).

In the foregoing description and in the accompanying drawings, specific terminology and drawing symbols have been set forth to provide a thorough understanding of the present invention. In some instances, the terminology and symbols may imply specific details that are not required to practice the invention.

For example, any of the specific numbers of bits, signal path widths, signaling or operating frequencies, component circuits or devices and the like may be different from those described above in alternative embodiments.

Also, the interconnection between circuit elements or circuit blocks shown or described as multi-conductor signal links may alternatively be single-conductor signal links, and single conductor signal links may alternatively be multi-conductor signal links.

Signals and signaling paths shown or described as being single-ended may also be differential, and vice-versa. Similarly, signals described or depicted as having active-high or active-low logic levels may have opposite logic levels in alternative embodiments.

Component circuitry within integrated circuit devices may be implemented using metal oxide semiconductor (MOS) technology, bipolar technology or any other technology in which logical and analog circuits may be implemented.

With respect to terminology, a signal is said to be "asserted" when the signal is driven to a low or high logic state (or charged to a high logic state or discharged to a low logic state) to indicate a particular condition.

Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition).

A signal driving circuit is said to "output" a signal to a signal receiving circuit when the signal driving circuit asserts (or de-asserts, if explicitly stated or indicated by context) the signal on a signal line coupled between the signal driving and signal receiving circuits.

A signal line is said to be "activated" when a signal is asserted on the signal line, and "deactivated" when the signal is de-asserted.

Additionally, the prefix symbol "/" attached to signal names indicates that the signal is an active low signal (i.e., the asserted state is a logic low state).

A line over a signal name (e.g., ' ') is also used to indicate an active low signal. The term "coupled" is used herein to express a direct connection as well as a connection through one or more intervening circuits or structures.

Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

In the above description, numerous details are set forth. It will be apparent, however, to one of ordinary skill in the art having the benefit of this disclosure, that embodiments of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this disclosure, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this disclosure and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A command and address (CA) buffer component to be disposed on a first memory module, the CA buffer component comprising:
   a first pin;
   a second pin; and
   component circuitry coupled to the first pin and the second pin, wherein the component circuitry is configured to:
      receive a first chip select (CS) signal from a memory controller component via the first pin, the first CS signal to specify selection of a first rank;
      receive a second CS signal from a second CA buffer component of a second memory module via the second pin, the second CS signal to specify selection of a second rank;
      send a third CS signal to a first subset of a plurality of device sites of the first memory module responsive to the first CS signal, wherein each device site, of the plurality of device sites, is a location at which at least one memory device is disposed, wherein the first subset corresponds to the first rank; and
      send a fourth CS signal to a second subset of the plurality of device sites responsive to the second CS signal, wherein the second subset corresponds to the second rank.

2. The CA buffer component of claim 1, further comprising:
   a third pin coupled to the component circuitry, wherein the component circuitry is further configured to:
      receive a fifth CS signal from a third memory module via the third pin, the fifth CS signal to specify selection of a third rank; and
      send a sixth CS signal to a third subset of the plurality of device sites responsive to the fifth CS signal, wherein the third subset corresponds to the third rank.

3. The CA buffer component of claim 1, wherein the component circuitry comprises:
   a first flip-flop coupled to the first pin;
   a second flip-flop coupled to an output of the first flip-flop, wherein an output of the second flip-flop is coupled to the first subset of the plurality of device sites; and
   a third flip-flop coupled to the second pin, wherein an output of the third flip-flop is coupled to the second subset of the plurality of device sites.

4. The CA buffer component of claim 3, wherein the first flip-flop, the second flip-flop, and the third flip-flop are clocked by a timing signal.

5. The CA buffer component of claim 4, wherein the component circuitry further comprises a phase locked loop (PLL) coupled to a fourth pin to receive a clock signal and to generate the timing signal.

6. The CA buffer component of claim 1, wherein the component circuitry comprises:
   a first flip-flop coupled to the first pin;
   a second flip-flop coupled to an output of the first flip-flop, wherein an output of the second flip-flop is coupled to the first subset of the plurality of device sites;
   an input buffer coupled to the second pin; and
   a third flip-flop coupled to an output of the input buffer, wherein an output of the third flip-flop is coupled to the second subset of the plurality of device sites, wherein the first flip-flop, the second flip-flop, and the third flip-flop are clocked by a timing signal.

7. The CA buffer component of claim 6, wherein the component circuitry further comprises a phase locked loop (PLL) coupled to a fourth pin to receive a clock signal and to generate the timing signal.

8. The CA buffer component of claim 3, wherein the component circuitry further comprises an output buffer coupled to the output of the first flip-flop, wherein an output of the output buffer is coupled to the second pin, wherein the output buffer, responsive to the first CS signal, is to:
   generate a copy of the first CS signal; and
   send the copy of the first CS signal to the second CA buffer component via the second pin.

9. The CA buffer component of claim 1, wherein each of the plurality of device sites comprises at least one of a single memory die, a package stack of at least two memory dies, or a die stack of at least two memory dies.

10. The CA buffer component of claim 1, wherein each of the plurality of device sites comprises a double data rate fourth generation (DDR4) dynamic random-access memory (DRAM) device.

11. A command and address (CA) buffer component comprising:
   a primary interface;
   a secondary interface;
   a third interface; and
   component circuitry coupled to the primary interface, the secondary interface, and the third interface, wherein the component circuitry is configured to:
      receive a first chip select (CS) signal from a memory controller component via the primary interface, the first CS signal to specify selection of a first rank;
      receive a second CS signal from a second CA buffer component via the third interface, the second CS signal to specify selection of a second rank;
      send a third CS signal to a first subset of a plurality of device sites, via the secondary interface, responsive to the first CS signal, wherein each device site, of the plurality of device sites, is a location at which at least one memory device is disposed, wherein the first subset corresponds to the first rank; and
      send a fourth CS signal to a second subset of the plurality of device sites responsive to the second CS signal, wherein the second subset corresponds to the second rank.

12. The CA buffer component of claim 11, wherein the component circuitry comprises:
   a first flip-flop coupled to a first pin of the primary interface, the first flip-flop is configured to receive the first CS signal;
   an output driver coupled to an output of the first flip-flop and a second pin, the output driver to generate a copy of the first CS signal on the second pin; and
   a first input buffer coupled to the second pin, the first input buffer to receive the second CS signal on the second pin.

13. The CA buffer component of claim 12, wherein the component circuitry further comprises:
   a multiplexer coupled to an output of the first input buffer and the output of the first flip-flop, wherein the multiplexer is configured to select one of the output of the first input buffer and the output of the first flip-flop;
   a second flip-flop coupled to an output of the multiplexer;
   a first set of pins;
   a second input buffer coupled to the first set of pins;
   a second set of pins; and
   CS generation logic coupled to the output of the second flip-flop, an output of the second input buffer, and the second set of pins, wherein the CS generation logic is configured to:
      receive a count from a counter and signals on the first set of pins via the second input buffer; and
      generate a set of CS signals on the second set of pins.

14. The CA buffer component of claim 13, wherein the first flip-flop and the second flip-flop are clocked by a timing signal.

15. The CA buffer component of claim 14, wherein the component circuitry comprises a phase locked loop (PLL) coupled to a fourth pin of the primary interface to receive a clock signal and to generate the timing signal.

16. The CA buffer component of claim 12, wherein the component circuitry further comprises:
   a second flip-flop;
   a first set of pins of the secondary interface;
   a second input buffer coupled to the first set of pins;
   a second set of pins of the secondary interface; and
   CS generation logic coupled to the output of the second flip-flop, an output of the second input buffer, and the second set of pins, wherein the CS generation logic is configured to:
      receive the first CS signal via the first flip-flop and the second flip-flop;
      receive the second CS signal via the first input buffer;
      send the third CS signal to the first subset of the plurality of device sites via the second set of pins, responsive to the first CS signal; and
      send the fourth CS signal to the second subset of the plurality of device sites responsive to the second CS signal, wherein the first flip-flop and the second flip-flop are clocked by a timing signal.

17. The CA buffer component of claim 16, wherein the component circuitry comprises a phase locked loop (PLL) coupled to a fourth pin of the primary interface to receive a clock signal and to generate the timing signal.

18. The CA buffer component of claim 11, wherein each of the plurality of device sites comprises at least one of a single memory die, a package stack of at least two memory dies, or a die stack of at least two memory dies, wherein each of the plurality of device sites comprises a double data rate fourth generation (DDR4) dynamic random-access memory (DRAM) device.

19. A method comprising:
   receiving, by component circuitry of a command and address (CA) buffer component, a first chip select (CS) signal from a memory controller component via a first pin, the first CS signal to specify selection of a first rank;
   receiving, by the component circuitry, a second CS signal from a second CA buffer component via a second pin, the second CS signal to specify selection of a second rank;
   sending, by the component circuitry, a third CS signal to a first subset of a plurality of device sites responsive to the first CS signal, wherein each device site, of the plurality of device sites, is a location at which at least one memory device is disposed, wherein the first subset corresponds to the first rank; and
   sending, by the component circuitry, a fourth CS signal to a second subset of the plurality of device sites responsive to the second CS signal, wherein the second subset corresponds to the second rank.

20. The method of claim 19, further comprising:
generating, by the component circuitry, a copy of the first CS signal responsive the receiving the first CS signal; and
sending, by the component circuitry, the copy of the first CS signal to the second CA buffer component via the second pin.

\* \* \* \* \*